United States Patent
Jeong et al.

[11] Patent Number: 6,060,778
[45] Date of Patent: May 9, 2000

[54] BALL GRID ARRAY PACKAGE

[75] Inventors: Tae Sung Jeong, Ich'on; Ki Tae Ryu; Tae Keun Lee, both of Inch'on; Keun Hyoung Choi, Ich'on; Han Shin Youn, Seoul; Jum Sook Park, Ich'on, all of Rep. of Korea

[73] Assignee: Hyundai Electronics Industries Co. Ltd., Kyoungki-do, Rep. of Korea

[21] Appl. No.: 09/060,981

[22] Filed: Apr. 15, 1998

[30] Foreign Application Priority Data

May 17, 1997 [KR] Rep. of Korea ............ 97-19144
May 17, 1997 [KR] Rep. of Korea ............ 97-19145

[51] Int. Cl.⁷ .................... H01L 23/10; H01L 23/48; H01L 23/28
[52] U.S. Cl. ............... 257/710; 257/697; 257/787; 257/700; 257/783
[58] Field of Search ............... 257/710, 693, 257/698, 700, 701–703, 706–708, 787, 783

[56] References Cited

U.S. PATENT DOCUMENTS

| | | | |
|---|---|---|---|
| 4,835,598 | 5/1989 | Higuchi et al. | 257/675 |
| 4,897,508 | 1/1990 | Mahulikar et al. | 257/708 |
| 5,105,259 | 4/1992 | McShane et al. | |
| 5,147,821 | 9/1992 | McShane et al. | |
| 5,404,273 | 4/1995 | Akagawa | 361/707 |
| 5,583,378 | 12/1996 | Marrs et al. | 257/710 |
| 5,672,909 | 9/1997 | Glenn et al. | 257/668 |
| 5,689,091 | 11/1997 | Hamzehdoost et al. | 174/255 |
| 5,708,567 | 1/1998 | Shim et al. | 257/675 |
| 5,777,387 | 7/1998 | Yamashita et al. | 257/737 |
| 5,796,170 | 8/1998 | Marcantonio | 257/786 |
| 5,814,883 | 9/1998 | Sawai et al. | 257/712 |
| 5,844,168 | 12/1998 | Schueller et al. | 174/52.4 |

FOREIGN PATENT DOCUMENTS

| | | |
|---|---|---|
| 4-119653 | 4/1992 | Japan. |
| 97-13234 | 3/1997 | Rep. of Korea. |
| 2136205 | 9/1984 | United Kingdom. |
| 2189084 | 10/1987 | United Kingdom. |

OTHER PUBLICATIONS

English translation of Purpose and Constitution for KR97–13234 (Mar. 29, 1997).
English translation of Purpose and Constitution for JP4–119653 (Apr. 21, 1992).

*Primary Examiner*—Mahshid Saadat
*Assistant Examiner*—Jhihan B. Clark
*Attorney, Agent, or Firm*—Ware, Fressola, Van Der Sluys & Adolphson LLP

[57] ABSTRACT

Disclosed is a packaged integrated circuit device with high heat dissipation performance and low weight. The packaged integrated circuit device includes an interconnection substrate having at least one layer of conductive trace material and at least one layer of insulating material and also having a first surface and a second surface disposed opposite to the first surface and having a plurality of electrical contacts formed on the second surface. At least one metal thermal conductive layer having a first surface is attached on the first surface of the interconnection substrate and having a second surface exposed to an exterior. A through hole region is formed in the interconnection substrate and the thermal conductive layer. An integrated circuit chip having a first surface exposed to an exterior and having also a second surface with a plurality of bond pads, opposite to the first surface of the integrated circuit chip, is placed within the through hole region. A plurality of bond wires make an electrical connection of the bond pads with the conductive trace layers. The bond wires and the integrated circuit chip are enclosed with an insulating encapsulant material. The through hole region is also filled with the insulating encapsulant material.

8 Claims, 21 Drawing Sheets

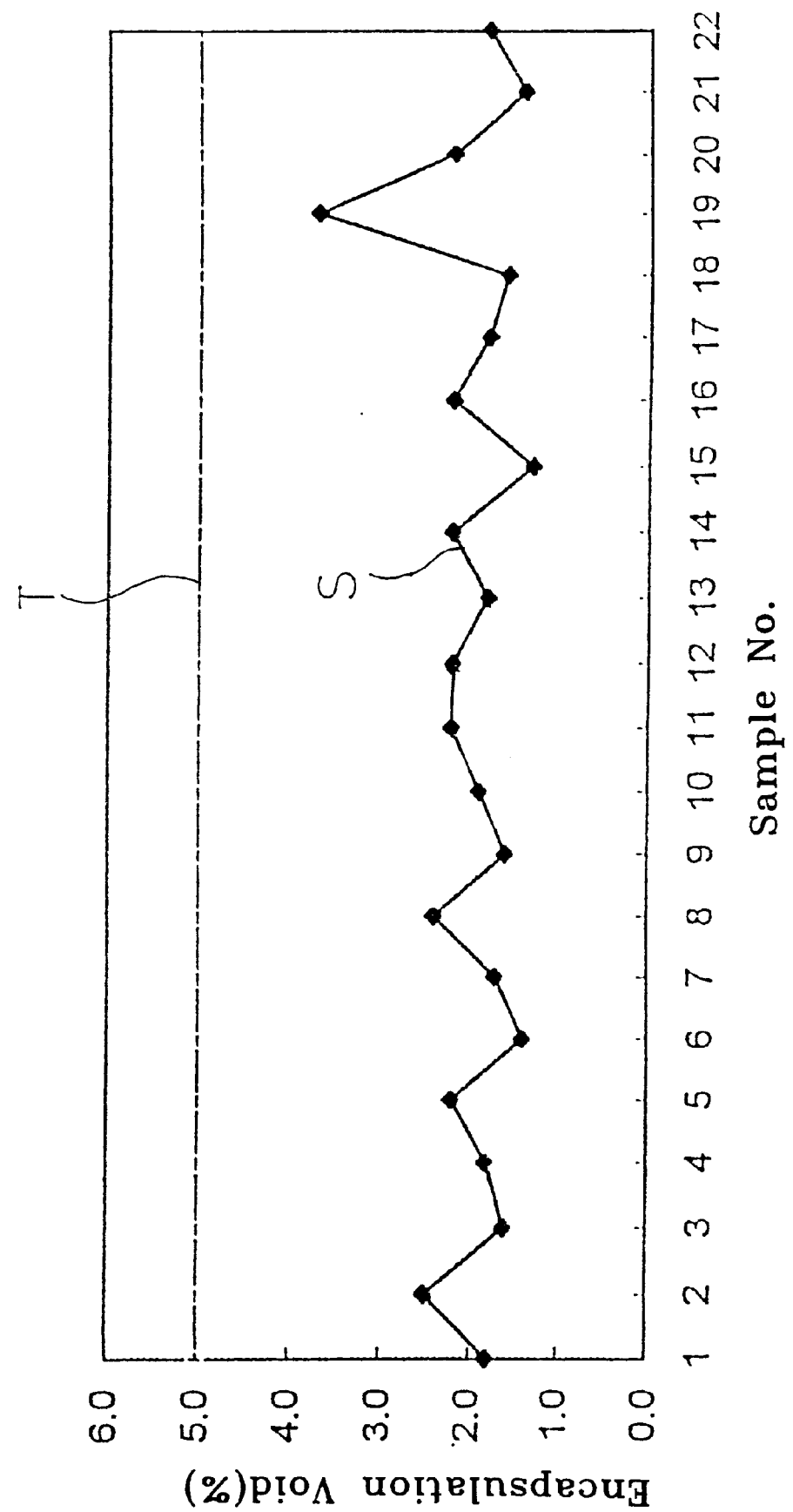

BALL GRID ARRAY PACKAGE

BACKGROUND OF THE INVENTION

This invention relates to a package having electronic devices such as integrated circuit chips, and in particular to a ball grid array package with reduced weight and low manufacturing cost and a method of fabricating the same.

In early generations, integrated circuit chips were packaged in a metal or a ceramic. A method for forming a semiconductor package by a metal or a ceramic has an excellent thermal properties. However, it has shortcomings such as high manufacturing cost and time consuming manufacturing techniques. To solve such shortcomings, there are proposed many packages the most notable one of which is a plastic molded package. Particularly, a plastic molded ball grid array package obviates a difficulty in surface mounting prior art fine pitch plastic packages. The plastic molded ball grid array packages also eliminate the need to route packages leads to the outer edges of the integrated circuit package. The plastic molded ball grid array packages also allow for smaller package and very close spacing of packages mounted to the same printed circuit board. Finally, ball grid array packages provide shorter interconnection lengths which results in improved electrical performance. The advantages described above, along with the low cost of ball grid array packaging, make ball grid array packages an ideal packaging format for many integrated circuit applications.

FIG. 1 shows a cross-sectional view of a prior art ball grid array package. The ball grid array package shown in FIG. 1 includes an interconnection substrate 1 with integrated circuit pattern and an integrated circuit chip 2 attached to the substrate 1 by adhesive preform 3 and having a plurality of bond pads 2a on the upper surface thereof. The circuit pattern of the substrate 1 and the bond pad 2a on the integrated circuit chip 2 are also connected to each other. Also, to protect the surface of the integrated circuit chip 2 from an outer circumstance, a wire bonding portion of the substrate 1 and the integrated circuit chip 2 are encapsulated by an epoxy resin 5. On the lower surface of the substrate 1 are attached a plurality of solder balls 6 for making electrical connection with power supply terminals formed on a mother board(not shown).

The ball grid array package shown in FIG. 1 lowers the reliability of the integrated circuit chip and still more has relatively bad heat dissipation characteristics which incur a breakdown of the integrated circuit chip. So as to dissipate the heat generated from such integrated circuit chip into the exterior of the package, there is a problem in that still more power is consumed. Also, the overall thickness of such package is very thick.

Recently, to improve the heat dissipation characteristics of the ball grid array package, a super ball grid array package having a heat sink for dissipating the heat generated therefrom has been developed.

FIG. 2 is a cross-sectional view showing the super ball grid array package having a heat sink. Referring to FIG. 2, the super ball grid array package includes an interconnection substrate 11 comprised of a conductive trace layer 22 and an insulating layer 23, and a copper layer 19 on one surface of which is attached to the insulating layer 23 of the interconnection substrate 11 by means of an adhesive preform 18. On the respective central portions of the interconnection substrate 11 and the copper layer 19 are formed an opening so that the opening forms a well region 14 through the interconnection substrate 11 and the copper layer 19. On a surface of the copper layer 19 is formed a heat sink 20 for improving the heat dissipation characteristics of the package via the adhesive layer 18a. In this regard, the heat sink 20 is thick such that it can resist a stress generated during an attachment of the integrated circuit chip to the heat sink 20, a wire bonding, and an encapsulation, which are carried out in a condition where the heat sink 20 is attached to the copper layer 19. In the well region 14, the integrated circuit chip 12 having a plurality of bond pads 12a on the surface thereof is disposed and the integrated circuit chip 12 is attached to the heat sink 20 through the adhesive preform 18b. The bond pads 12a are electrically connected to a conductive trace layer 23 via bond wires 15. Further, a wire-bonded portion of the substrate 11 and the integrated circuit chip 12 is encapsulated via insulating encapsulant material and on the surface of the substrate 11 is attached a plurality of solder balls 17 for making electrical connection of the package with a mother board(not shown).

The super ball grid array package shown in FIG. 2 has excellent heat dissipation characteristics, compared with the package shown in FIG. 1. However, since the super ball grid array package of FIG. 2 has the heavy weight, there is a problem in that the super ball grid array package can not be applied to the notebook, the pocket computer, the cellular phone, etc., in which the light weight is required. Since the expensive two or more copper layers are stacked, there is a drawback in which the cost is expensive and the thickness of the package is still thick.

Accordingly, to solve the above problems, one object of this invention is to provide a packaged integrated circuit device having an excellent heat dissipation capability, a low weight, a thinner thickness and a low manufacturing cost.

Another object of this invention is to provide a method of manufacturing the same capable of reducing the manufacturing time, an apparatus investment cost and a manufacturing cost.

SUMMARY OF THE INVENTION

To accomplish the above objects of this invention, a packaged integrated circuit device according to the first embodiment of this invention includes an interconnection substrate having one or more conductive trace layers and one or more insulating layers and also having a first surface and a second surface with a plurality of electrical contacts, opposite to the first surface. One or more metal thermal conductive layers having a first surface and a second surface opposite the first surface and exposed to an exterior are attached to the first surface of the interconnection substrate via the first surface of the metal thermal conductive layers. A through hole region is formed at the interconnection substrate and at the metal thermal conductive layers. The integrated circuit chip has a first surface exposed to an exterior of the package and a second surface opposite to the first surface of the integrated circuit chip with a plurality of bond pads and is also disposed within the through hole region. A plurality of bond wires make an electrical connection of the bond pads with the conductive trace layers. An encapsulant material encloses the bond wires and the integrated circuit chip. The through hole region is also filled with the encapsulant material.

Further, a packaged integrated circuit device according to the second embodiment of this invention includes an interconnection substrate having one or more conductive trace layers and one or more insulating layers and also having a first surface and a second surface with a plurality of electrical contacts, opposite to the first surface. One or more first metal thermal conductive layers having a first surface and a second surface opposite the first surface are attached to the first surface of the interconnection substrate by the first surface of the first metal thermal conductive layers. A second metal thermal conductive layer has a first surface which is attached to the second surface of the first metal thermal conductive layers and a second surface which is exposed to an exterior of the package, and is opposite to the first surface of the second metal thermal conductive layers. A hole region which exposes the second surface of the second metal thermal conductive layer is formed at the interconnection substrate and at the first metal thermal conductive layers. Disposed within the hole region is the integrated circuit chip having a first surface attached to the first surface of the second metal thermal conductive layer and a second surface opposite to the first surface of the integrated circuit chip with a plurality of bond pads. The bond pads are electrically connected with the conductive trace layers via a plurality of bond wires. The bond wires and the integrated circuit chip are enclosed with encapsulant material. The hole region is also filled with the encapsulant material.

Moreover, a packaged integrated circuit device according to a third embodiment of this invention includes an interconnection substrate having a first surface and a second surface with a plurality of electrical contacts opposite to the first surface of the interconnection substrate; one or more first metal thermal conductive layers having a first surface attached to the first surface of the interconnection substrate and a second surface opposite to the first surface of the first metal thermal conductive layers; a second metal thermal conductive layer with a opening at the central portion thereof, having a first surface attached to the second surface of the first metal thermal conductive layers and a second surface exposed to an exterior of the package and opposite to the first surface of the second metal thermal conductive layer; a hole region which is formed in the interconnection substrate and the first metal thermal conductive layers and which exposes the first surface of the second metal thermal conductive layer; an integrated circuit chip disposed within a central portion of the hole region and having a first surface and a second surface with a plurality of bond pads formed thereon, opposite the first surface, the first surface of the chip being in contact with the second metal thermal conductive layer and having bigger surface area than a cross sectional area of the contacting portion of the opening with the integrated circuit chip; a plurality of bond wires making electrical connection of the bond pads with the conductive trace layer; an encapsulation material for enclosing the bond wires and the integrated circuit chip and also for filling the hole region.

And, a packaged integrated circuit device according to a fourth embodiment of this invention includes an interconnection substrate having at least one conductive trace layer and at least one insulating layer and also having a first surface and a second surface having a plurality of electrical contacts thereon, opposite to the first surface of the interconnection substrate;

a dielectric layer attached to an outer portion of the first surface of the interconnection substrate;

a metal thermal conductive layer having a first surface and a second surface opposite to the first surface thereof, the first surface of the thermal conductive layer being attached to an internal portion of the first surface of the interconnection substrate and also contacted with the internal end portion of the dielectric layer;

a hole region which is formed at the central portion of the interconnection substrate and which exposes the first surface of the metal conductive layer;

an integrated circuit chip disposed within the hole region, the integrated circuit chip having a first surface attached the first surface of the interconnection substrate and a second surface opposite to the first surface of the integrated circuit chip, the second surface of the integrated circuit chip having a plurality of bonding pads formed thereon;

a plurality of bond wires for electrically connecting the bond pads with the conductive trace layer; and an encapsulant material enclosing the bond wires and the integrated circuit chip, the hole region being filled with the encapsulant material.

Further, the present invention provides a method of manufacturing a packaged integrated circuit device according to other aspect thereof including the steps of:

providing a heater block within which an evacuating hole is formed, with the evacuating hole being connected to a vacuum generating means so as to form a vacuum within the evacuating hole; loading on the heater block an assembly which comprises an interconnection substrate and a metal thermal conductive layer attached to the substrate and in which a hole region is formed at a central portion, such that the evacuating hole is aligned with the central portion of the hole region; attaching the integrated circuit chip on the heater block within the hole region by vacuum formed within the evacuating hole; electrically connecting the interconnection substrate with the integrated circuit chip on the heater block by bond wires; and encapsulating the bond wires and the integrated circuit chip, with filling the hole region with an encapsulant material.

Also, another method of fabricating a packaged integrated circuit device according to this invention comprises:

providing a heat block which has an evacuating hole for forming a vacuum, the evacuating hole of the heater block being connected with a vacuum generating means; loading on the heater block an assembly which comprises an interconnection substrate, a first metal thermal conductive layer attached to the back surface of the substrate, and a second metal thermal conductive layer attached to the back surface of the first metal thermal conductive layer and having an opening and in which a hole region connected with the opening of the second metal thermal conductive layer and exposing a part of the surface of the second metal thermal conductive layer is formed at a central portion of the substrate and at a central portion of the first metal thermal conductive layer, such that the second metal thermal conductive layer is in contact with the surface of the heater block while the opening of the second metal thermal conductive layer and the evacuating hole are communicated to each other;

evacuating an air through the evacuating hole of the heater block and the opening of the second metal thermal conductive layer to the surface of an integrated circuit chip such that the chip is aligned within the hole region; electrically connecting via bond wires the interconnection substrate and the integrated circuit chip on the heater block; and encapsulating the bond wires and the integrated circuit chip with an encapsulant material, filling the hole region with the encapsulant material.

BRIEF DESCRIPTION OF THE DRAWINGS

Hereinafter, the preferred embodiments of the invention will be described in detail with the accompanying drawings.

FIGS. 12A to 12C are graphs showing the encapsulation property of the package according to the first embodiment of the present invention.

DETAILED DESCRIPTION OF THE INVENTION

Figure 3:
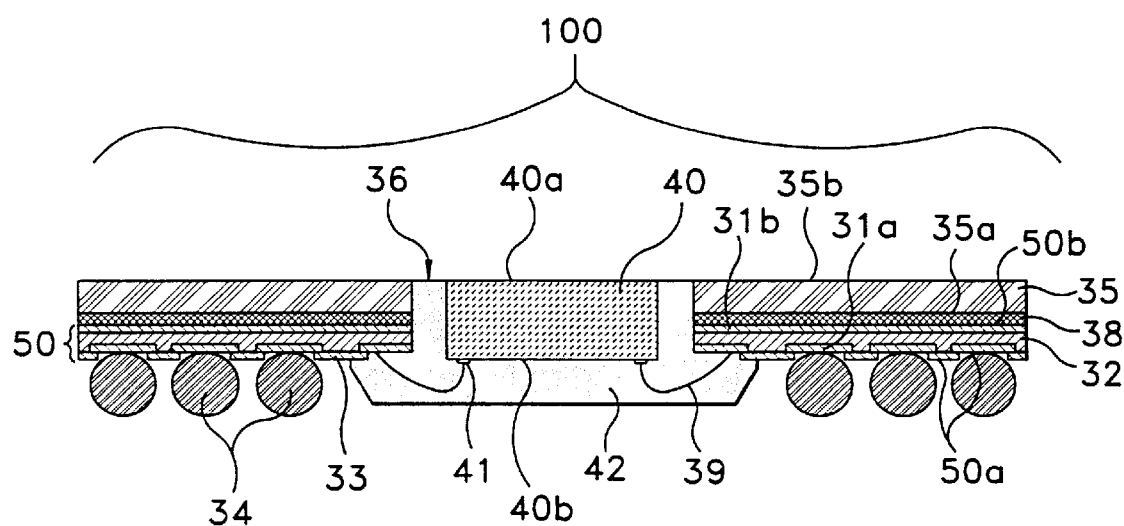
FIG. 3 is a cross-sectional view showing a ball grid array package according to a first embodiment of this invention.

FIG. 3 is a cross-sectional view showing a ball grid array package according to a first embodiment of this invention. The ball grid array package 100 includes an interconnection substrate 50 comprising a first conductive trace layer 31*a*, a second conductive trace layer 31*b*, and an insulating layer 32 disposed between those layers 31*a* and 31*b*. Each of the first and second conductive trace layers 31*a* and 31*b* is comprised of many elements disposed in parallel to each other with a selected distance. The respective spaces between two of the many elements are filled with the insulating layer 32. The first and second conductive trace layers are preferably formed of copper.

Further, the interconnection substrate 50 includes a first surface 50*a* exposed to the exterior of the package 100 and including one surface of the first conductive trace layer 31*a* and a second surface 50*b* opposed to the first surface 50*a*, including one surface of the second conductive trace layer 31*b*. The first surface 50*a* of the interconnection substrate 50 includes one surface of the first conductive trace layer 31*a* and one surface of an insulating solder mask layer 33 formed such that the one surface of the first conductive trace layer 31*a* is exposed. On the first surface 50*a* of the interconnection substrate 50 are attached a plurality of solder balls 34 serving as electrical contacts for making electrical connection of the interconnection substrate 50 with the exterior terminal (not shown) of the package 100.

Further, on the second surface 50*b* of the interconnection substrate 50 is attached a metal thermal conductive layer 35 serving as the heat sink through the adhesive preform 38. It is preferable to use as the adhesive preform 38 an adhesive tape having adhesive material at both surfaces although the liquid phase adhesive can be applied. The metal thermal conductive layer 35 has a first surface 35*a* attached to the second surface 50*b* of the interconnection substrate 50, and a second surface 35*b* opposite the first surface 35*a* and exposed to the exterior of the package 100.

Figure 4:
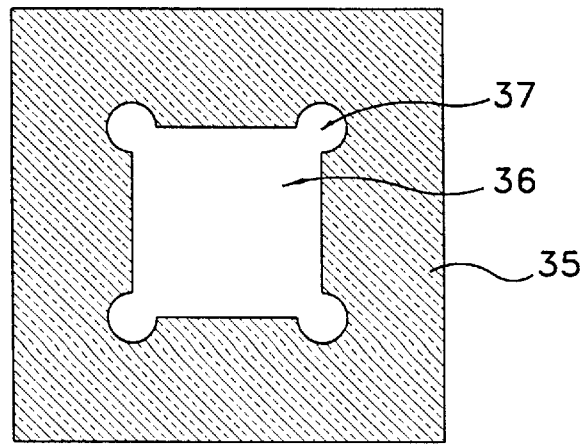
FIG. 4 is a plan view showing a hole region formed in a package according to the present invention.

Moreover, the metal thermal conductive layer 35 may, preferably, be made of copper, aluminum or silver. In the central portion of the interconnection substrate 50 and the metal thermal conductive layer 35 is formed a hole region 36 extending through them in a vertical direction. The hole region 36, preferably, has a squared cross sectional shape along with circular shapes 37 at four corners thereof shown in FIG. 4 which is a plane view of the package 100. In addition, the hole region 36 may have a rectangular, a circular, a diamond-like or a star-like shape in a cross sectional view and one of these shapes may have at edges thereof tetragonal shapes such as rectangular and diamond-like shapes, or at edges thereof triangular shapes.

Referring again to FIG. 3, in the central portion of the hole region 36 is disposed an integrated circuit chip 40 having a first surface 40*a* exposed to the exterior of the package 100 and a second surface 40*b* opposite thereto. On the second surface 40*b* of the integrated circuit chip 40 are formed a plurality of bond pads 41 and the bond pads 41 are electrically connected to the conductive trace layers 31*a* and 31*b* via bond wires 39.

Figure 5:
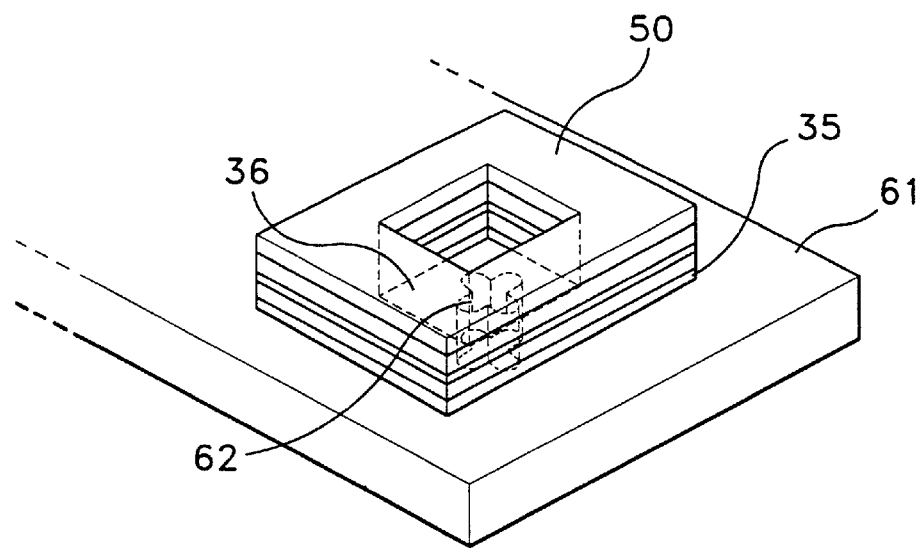
FIG. 5 is a perspective view showing a heater block used in fabricating a package according to the present invention.

So as to fabricate the package 100 shown in FIG. 3, on the heater block 61 shown in FIG.5 is loaded on an assembly which comprises the interconnection substrate 50 and the metal thermal conductive layer 35 attached to the second surface 50*b* of the substrate 50 and in which the through hole region is formed at a central portion. The assembly is formed as an unit. At a step of loading the assembly, the second surface 35*b* of the metal thermal conductive layer 35 faces the surface of the heater block 61. The process performed in such unit may omit a siglulation step in the further process. Referring to FIG. 3 along with FIG. 5, the heater block 61 has an evacuating hole 62 within the heater block 61. The evacuating hole 62 serves as a vacuum chamber which is evacuated by a vacuum generating means (not shown). Therefore, though not shown, a person having an ordinary skill in the art can easily think out various methods for forming a vacuum utilizing the evacuating hole in the heater block 61. For example, so as to form a vacuum within the evacuating hole 62, a method of connecting the evacuating hole 62 via a hose to a vacuum generating means (not shown) which is disposed at an exterior of the heater block 61 may be used. In loading the assembly on the heater block 61, the evacuating hole 36 is disposed within the hole region 36 with the second surface 35*b* of the metal thermal conductive layer 35 facing the surface of the heater block 61. Next, an integrated circuit chip 40 sawed in an unit is disposed within the hole region 36 of the interconnection substrate 50, with the first surface 40*a* thereof covering the evacuating hole 62. At this time, the integrated circuit chip 40 is aligned on the surface of the heater block 61, and thus is held on the surface thereof by a sucking force of vacuum acting on the first surface 40*a* via the evacuating hole from the vacuum generating means. Since the integrated circuit chip is held by such sucking force of vacuum, any die attachment process in the prior art is not required. Therefore, the package 100 according to this invention has thinner thickness and lower weight since die pads for the die attachment process are obviated from the package structure. Further, the method of manufacturing the package 100 has a benefit of reduced manufacturing cost since the die attachment process is obviated.

Following the step of aligning the integrated circuit chip 40, a wire bonding step for making electrical connection of a plurality of bond pads 41 of the integrated circuit chip 40 with the interconnection substrate 50 via bond wires 39 is carried out. The integrated circuit chip 40 and the bond wires are then encapsulated by an epoxy-based encapsulant material 42 with filling the hole region 36, in a state in which the integrated circuit chip 40 is held on the surface of the heater block 61 by a sucking force of vacuum. Next, the step of curing the encapsulant material 42 is performed.

Since the encapsulation and curing processes, respectively are carried out on the heater block directly after the wire bonding step, the prior art molding step is obviated.

Subsequently, a plurality of solder balls 34 are attached on the first surface 50a of the interconnection substrate 50 and a reflow process is then carried out.

In the ball grid array package 100 according to the first embodiment of this invention, since the second surface 40a of the integrated circuit chip 40 is exposed to the exterior of the package 100, the heat created from the integrated circuit chip 40 can be easily dissipated into the exterior of the package 100.

In reality, the package shown in FIG. 3 shows a thermal resistance of 15.8° C./W in an air flow of 2 m/sec as the result of a simulation test for evaluating the heat dissipation characteristics of the package. And, since the die pad which has been used for wire-bonding the integrated circuit chip 40 as in the prior art is obviated, the package according to this invention has a lower weight and a thinner thickness than in the prior art. The package shown in FIG. 3 has a thickness of 1.0 mm and also has about 55% of the weight of the package shown in FIG. 2. In addition, since a die attachment process, a molding process and a singulating process in manufacturing the ball grid array package 100 are not required, the method according to the invention has various benefits such as reduced manufacturing time, reduced investment cost and reduced manufacturing cost.

Figure 6:
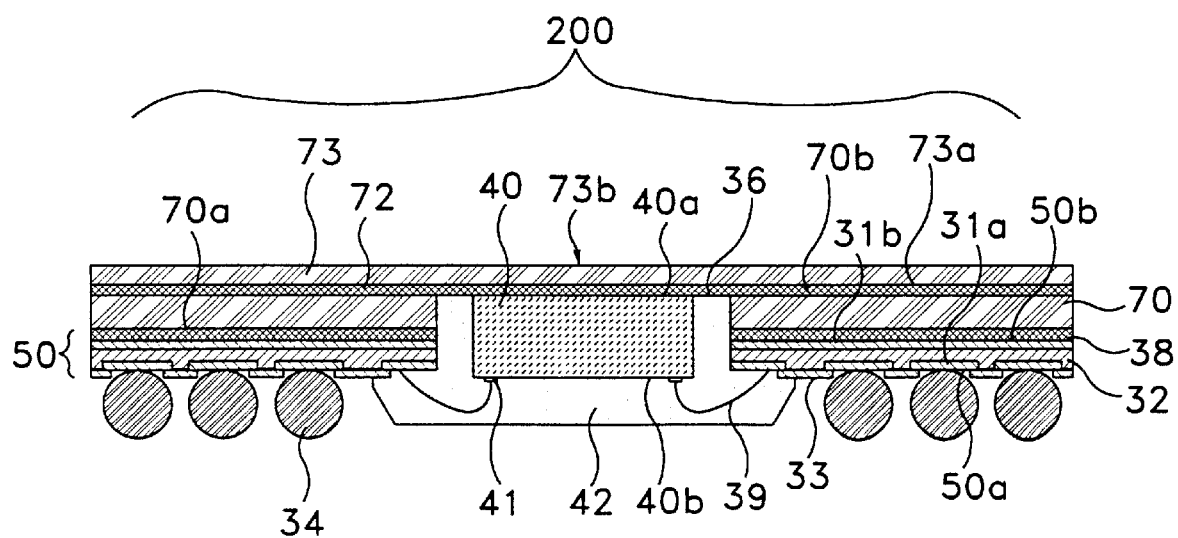
FIG. 6 is a cross sectional view showing a ball grid array package in accordance with a second embodiment of the present invention.

FIG. 6 is a cross sectional view showing a ball grid array package 200 according to a second embodiment of this invention. Refer to an explanation of the components in FIG. 3 regarding the components not explained in FIG. 6.

A ball grid array package 200 includes a first metal thermal conductive layer 70 having a first surface 70a attached to the second surface 50b of the interconnection substrate 50 via an adhesive material 38 and a second surface 70b opposite to the first surface 70a, serving as a heat sink; and a second metal thermal conductive layer 73 attached to the first metal thermal conductive layer 70 via an adhesive material 72. Preferable example of the adhesive materials 38 and 72 is a tape with adhesives at the both surface thereof. The second metal thermal conductive layer 73 has a first surface 73a attached to the second surface 70b of the first metal thermal conductive layer 70 and a second surface 73b opposite to the first surface 73a, exposed to the exterior of the package 200. Though not shown in drawings, so as to prevent moisture ingress and corrosion and improve adhesion of the first surface 73a and the second surface 73b to the first thermal conductive layer 70, the integrated circuit chip 40 and the encapsulant material 42, it is preferable to form a material such as nickel plating layer or black anodizing layer on the first surface 73a and the second surface 73a of the second thermal conductive layer 73. Also, though the second thermal conductive layer 73 is shown in the foil shape in the drawings, the second thermal conductive layer may also be formed of a plurality of pins attached to the first metal thermal conductive layer 70 via the adhesive material 72. Further, at the central portion of the interconnection substrate 50 and the first metal thermal conductive layer 70 is formed a hole region 36 exposing the first surface 73a of the second metal thermal conductive layer 73.

At a central portion of the hole region 36 is disposed the integrated circuit chip 40 having a first surface 40a attached to the first surface 73a of the second metal thermal conductive layer 73 via an adhesive 72 and a second surface opposite to the first surface 40a of the integrated circuit chip 40.

The package 200 shown in FIG. 6 may be manufactured by the same method as that of manufacturing the package 100 shown in FIG. 3, as described above. However, so as to manufacture the package 200, the method of manufacturing the package 200 further comprises the step of attaching the second metal thermal conductive layer 73 on the second surface 70b of the first metal thermal conductive layer 70 and the first surface 40a of the integrated circuit chip 40 by the adhesive 72 after the formation of the encapsulant material 42.

Figure 1:
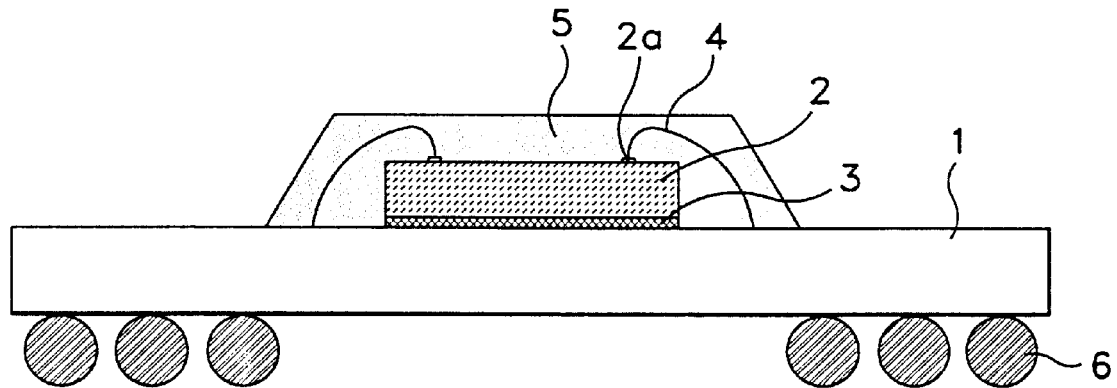
FIG. 1 shows a cross-sectional view of a prior art ball grid array package.
Figure 2:
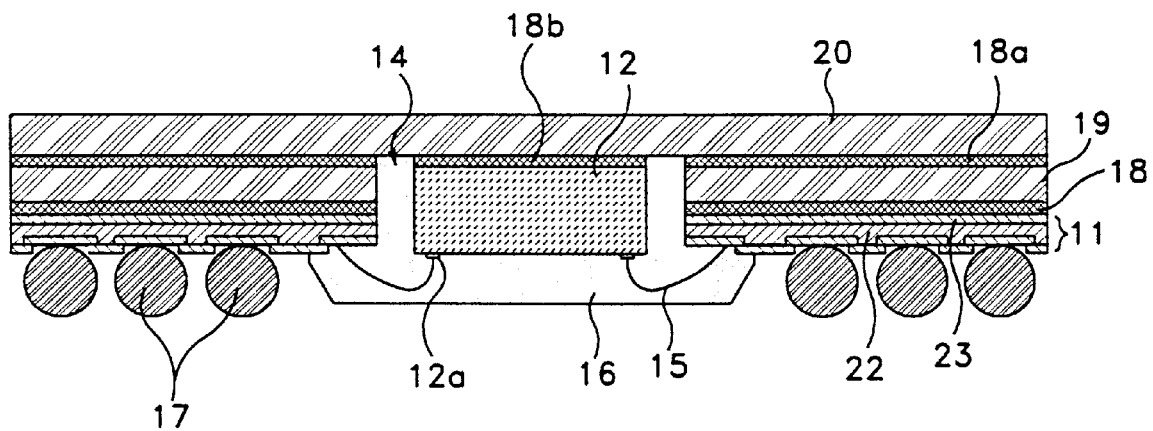
FIG. 2 is a cross-sectional view showing the super ball grid array package having a heat sink.

Furthermore, the package 200 shown in FIG. 6 has almost the same effect as the package 100 shown in FIG. 2. However, since the package 200 has the adhesive 72 formed all over the first surface of the second metal thermal conductive layer 73, the package 200 can more easily dissipate the heat created from the integrated circuit chip than the package shown in FIG. 2. The package 200 shown in FIG. 6 has a thermal resistance of 6.3° C./W in an air flow of 2 m/sec, as the result of the simulation test for evaluating the heat dissipation characteristics of the package shown in FIG. 6. And, the second metal thermal conductive layer 73 in the package 200 shown in FIG. 6 as a heat sink has a thinner thickness since it is attached after forming the encapsulation 42. Such thin thickness of the second metal thermal conductive layer is highly contributed to the reduction of the total thickness and weight of the package 200. The package 200 has a thickness of about 1.1 mm and has about 65% of the weight of the package shown in FIG. 2.

Figure 7:
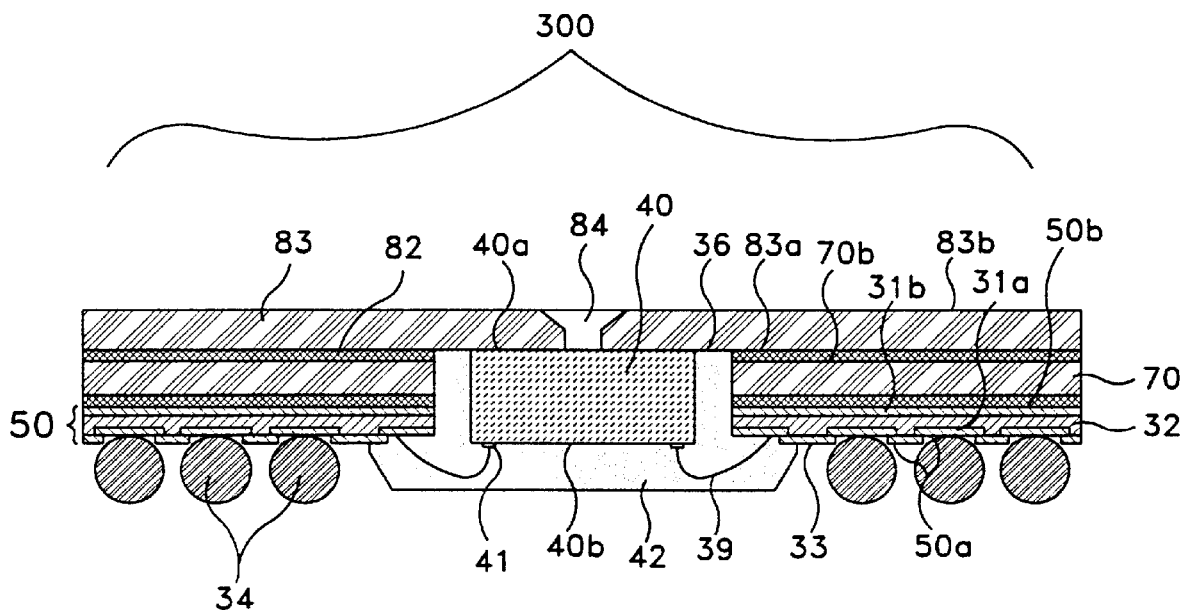
FIG. 7 is a cross sectional view showing a ball grid array package in accordance with a third embodiment of the present invention.

FIG. 7 is a cross sectional view showing a ball grid array package according to a third embodiment of this invention. Refer to the description of the package shown in FIG. 3 regarding the numerals not described in FIG. 7.

Referring to FIG. 7, a ball grid array package 300 includes a second metal thermal conductive layer 83 attached to the second surface 70b of the first metal thermal conductive layer 70 by an adhesive 82. Preferable example of the adhesive 82 is a tape with adhesives at both surfaces thereof. The second metal thermal conductive layer 83 has a first surface 83a attached to the second surface 70b of the first metal thermal conductive layer 70 and a second 83b exposed to the exterior of the package 300 and also has a opening 84 at a central portion thereof. Though not shown in drawings, so as to prevent moisture ingress and corrosion and improve adhesion of the first surface 83a and the second surface 83b of the second metal thermal conductive layer 83 to the first thermal conductive layer 70, and the encapsulant material 42, it is preferable to form a material such as nickel plating layer or black anodizing layer on the first surface 83a and the second surface 83b of the second thermal conductive layer 83. Though the second metal thermal conductive layer 83 is shown in a shape of a foil, the second metal thermal conductive layer 83 may be made of a plurality of pins attached to the first metal thermal conductive layer 70 by the adhesive 82. At a central portion of the hole region 36 is disposed the integrated circuit chip 40 and the first surface 40a of the integrated circuit chip 40 is also in direct contact with the first surface 83a of the second metal thermal conductive layer 83.

Furthermore, the package 300 shown in FIG. 7 may be manufactured by almost the same method as that of manufacturing the package 100 shown in FIG. 3, as described above.

Referring FIG. 7 along with FIG. 5, the assembly in which the first and second metal conductive layers 70 and 83 are attached onto the interconnection substrate 50 is loaded on the heater block 61, such that the second surface 83b of the second metal conductive layer 83 faces the surface of the heater block 61. In this regard, the interconnection substrate 50 and the first metal conductive layer 70 have the respective hole region 36 connected to each other. Afterwards, the integrated circuit chip 40 is aligned and held on the hole region 36. At this time, the first surface 40a of the integrated circuit chip 40 is in direct contact with the first surface 83a of the second metal conductive layer 83 by a sucking force of vacuum via the evacuating hole 62 and the opening 84 from the vacuum generating means. Next, wire bonding, encapsulation and solder ball attachment processes are performed as described above regarding the manufacture of the package 100 shown in FIG. 3.

The package 300 shown in FIG. 7 has almost the same effects as the package 100 shown in FIG. 3. However, since the package 300 has a heat sink 83 of a shape such as a foil or a pin, the package 300 can more easily dissipate the heat created from the integrated circuit chip than the package 100.

Actually, the package 300 shows a thermal resistance of 7.8° C./W under an air flow of 2 m/sec as the result of simulation test for evaluating heat dissipation characteristics of the package. And, the package shown in FIG. 7 has a thickness of 1.2 mm and has about 80% of the weight which the package shown in FIG. 2 has.

Figure 8:
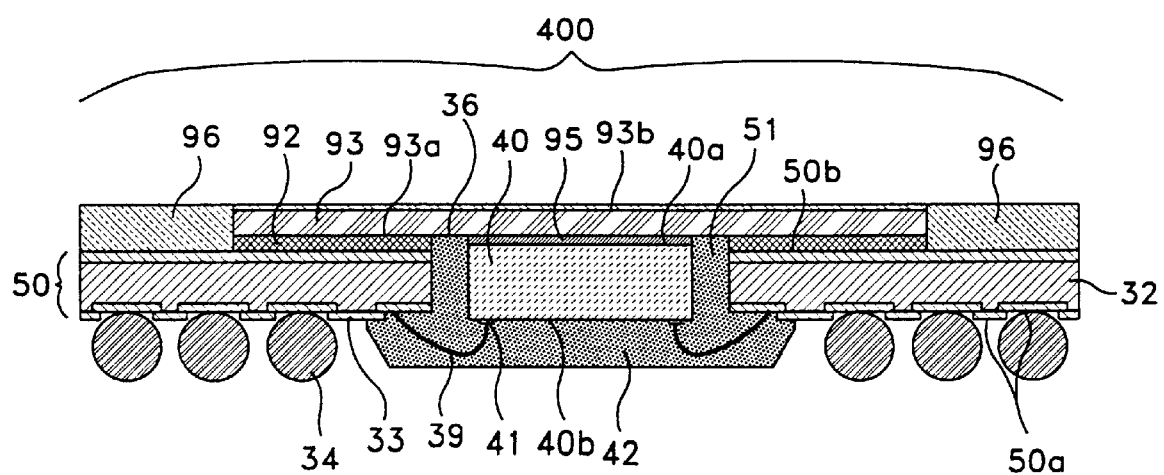
FIG. 8 is a cross sectional view showing a ball grid array package in accordance with a fourth embodiment of the present invention.

FIG. 8 is a cross-sectional view showing a ball grid array package 400 according to a fourth embodiment of this invention. In FIG. 8, regarding to non-described elements, refer to the descriptions about the package shown in FIG.3. Referring to FIG. 8, the ball grid array package 400 includes a metal thermal conductive metal layer 93 attached to an internal portion of the second surface 50b of the interconnection substrate 50 of the ball grid array package 400 by adhesive 92. The metal thermal conductive metal layer 93 has a first surface 93a attached to the second surface of the interconnection substrate 50, and a second surface 93b which is exposed to an exterior and is opposite to the first surface 93a. Furthermore, the metal thermal conductive metal layer 93 is preferable to be made of copper, silver or aluminum. In the case that the metal thermal conductive metal layer 93 is copper, so as to prevent the corrosion the second surface 93b is plated with the material such as nickel. In the case that the metal thermal conductive layer 93 is aluminum, the second surface 93b is black-anodized.

On a central portion of the interconnection substrate 50 is formed a hole region 36 exposing the first surface 93a of the metal thermal conductive layer 93. On a central portion of the hole region 36 is disposed an integrated circuit chip 40. The first surface 40a of the integrated circuit chip 40 is attached to a first surface 93a of the metal thermal conductive layer 93 by an adhesive 95. The adhesive 95 is preferable to contain silver so as to enhance the heat dissipation from the integrated circuit chip 40.

Moreover, on the external side portion of a second surface 50b of the interconnection substrate 50 is formed a dielectric layer 96 so as to prevent cracking and delamination of the package from moisture ingress through the metal thermal conductive layer 93 and the adhesive 92. An internal end portion of the dielectric layer 96 is in contact with an end portion of the metal thermal conductive layer 93. Also, the dielectric layer 96 is preferable to be made of solder resist, polyimide or epoxy.

In order to fabricate the package 400 shown in FIG. 8, the heater block 61 shown in FIG. 5 is also used. Referring to FIG. 8 along with FIG. 5, the assembly in which the metal thermal conductive layer 93 and the dielectric layer 96 are attached onto the second surface 50b of the integrated circuit chip 50 is loaded on the heater block 61 such that the metal thermal conductive layer 93 and the dielectric layer 96 faces the surface of the heater block 61 equipped with the evacuating hole 62. Here, the interconnection substrate 50 at its central portion has a hole region 36. At the time, the second surface 93b of the metal thermal conductive layer 93 is disposed on the heater block 61 with the perfect airtightness of the evacuating hole 62. Afterwards, a vacuum suctioning force generated by an operation of the vacuum apparatus connected to a heater block 61 is applied to the second surface 93a of the metal thermal conductive layer 93 through the evacuating hole 62, so that the interconnection substrate 50 is held on the surface of the heater block 61. Next, as described above regarding the fabrication of the package 100 of FIG. 3, the bonding, encapsulation and solder ball attach processes are performed.

The package 400 shown in FIG. 8 has still thinner thickness and lower weight since the package 400 does not have a thermal conductive metal layer at a side portion of the integrated circuit chip 40. Also, since the thin thermal conductive layer 93 is attached as a heat sink to the first surface 40a of the integrated circuit chip 40, the package 400 is estimated to be as good as the packages shown in FIGS. 3, 6 and 7 in terms of heat dissipation performance. Unlike the packages 100, 200 and 300 shown in FIGS. 3, 6 and 7, in fabricating the package 400 after the attachment of the integrated circuit chip 40 to the metal thermal conductive layer 93 by the adhesives 95, a wire bonding process and an encapsulation process are performed on the heater block 61. However, the wire bonding process and an encapsulation process are performed on the heater block 61 like the cases of the packages shown in FIGS. 3, 6 and 7. Therefore, the ball grid array package 400 has benefits such as a reduced fabricating time, a reduced investment cost and a manufacturing cost since there is no need to carry out a molding process and a singulation process in fabricating the ball grid array package 400. In addition, the package shown in FIG. 7 has a thickness of about 1.2 mm and has about 90% of the weight which the package shown in FIG. 2 has.

Figure 9:
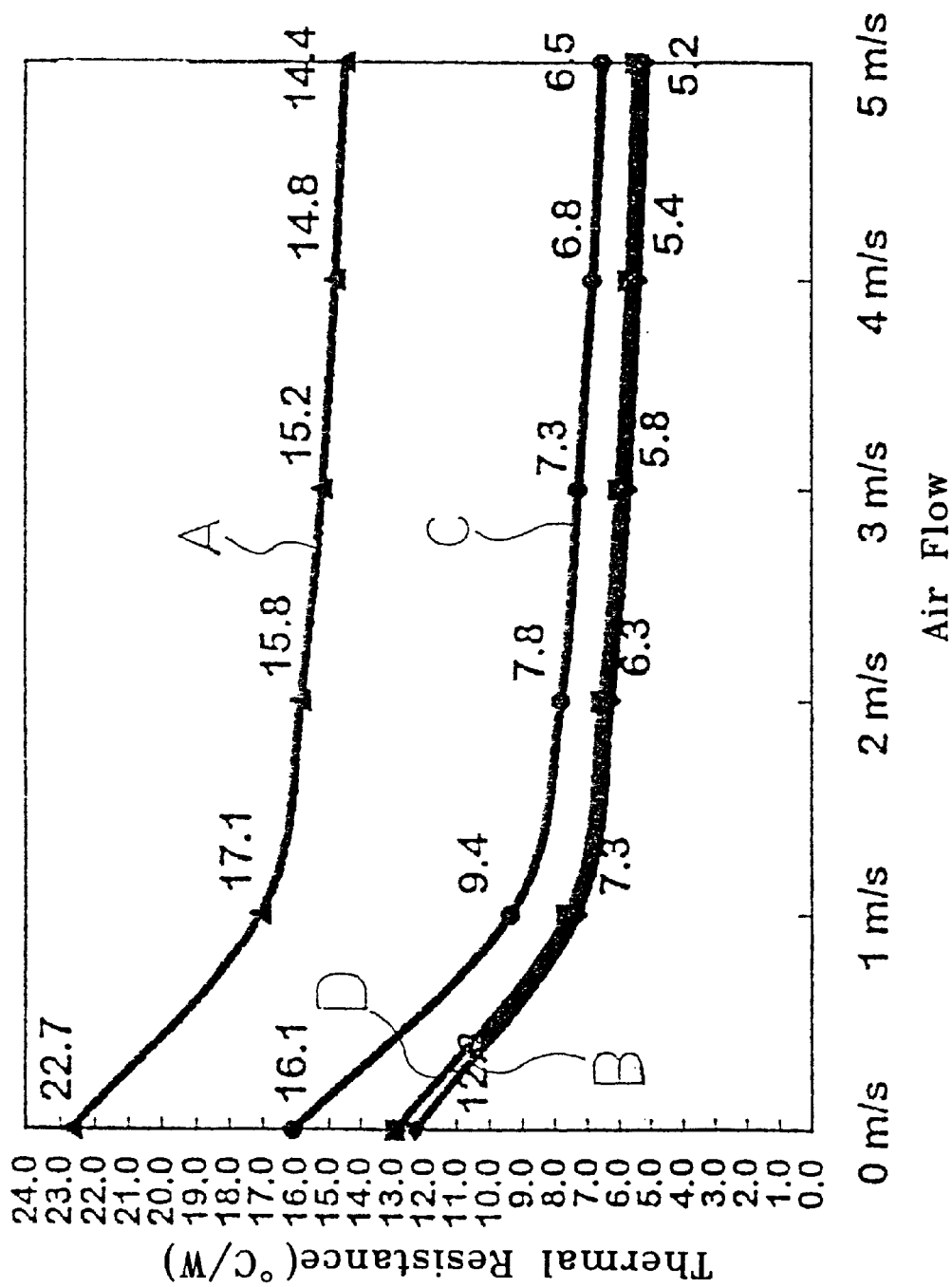
FIG. 9 shows graphs indicating a simulation test result for evaluating the thermal dissipation characteristics of packages according to the first to fourth embodiments of the present invention.

FIG. 9 is a graph showing the result of simulation test for evaluating heat dissipation characteristics of the packages according to the first to third embodiments of this invention.

In FIG. 9, the axis of ordinate is a thermal resistance in ° C./W, and the axis of abscissa is an air flow in m/sec. In FIG. 9, graph A is a test result of the package according to the first embodiment of this invention, graph B is a test result of the package according to the second embodiment thereof, graph C is a test result of the package according to the third embodiment thereof and the graph D is a test result of the package according to the fourth embodiment thereof.

As known in FIG. 9, the package according to the first embodiment show excellent thermal resistances of 15.8° C./W at an air flow of 2 m/sec. , although it does not have the heat sink which is attached to the backside of the integrated circuit chip. Such the thermal resistance of the package according to the first embodiment is sufficient to dissipate the heat generated from the integrated chip. And, the package according to the second embodiment shows the most excellent thermal resistance of about 6.3° C./W at the air flow of 2 m/sec. And the package according to the third embodiment shows the thermal resistance of about 7.8° C./W at the air flow of 2 m/sec. Finally, the package according to the fourth embodiment of this invention shows the thermal resistance of about 6.5° C./W at the air flow of 2 m/sec.

Figure 10:
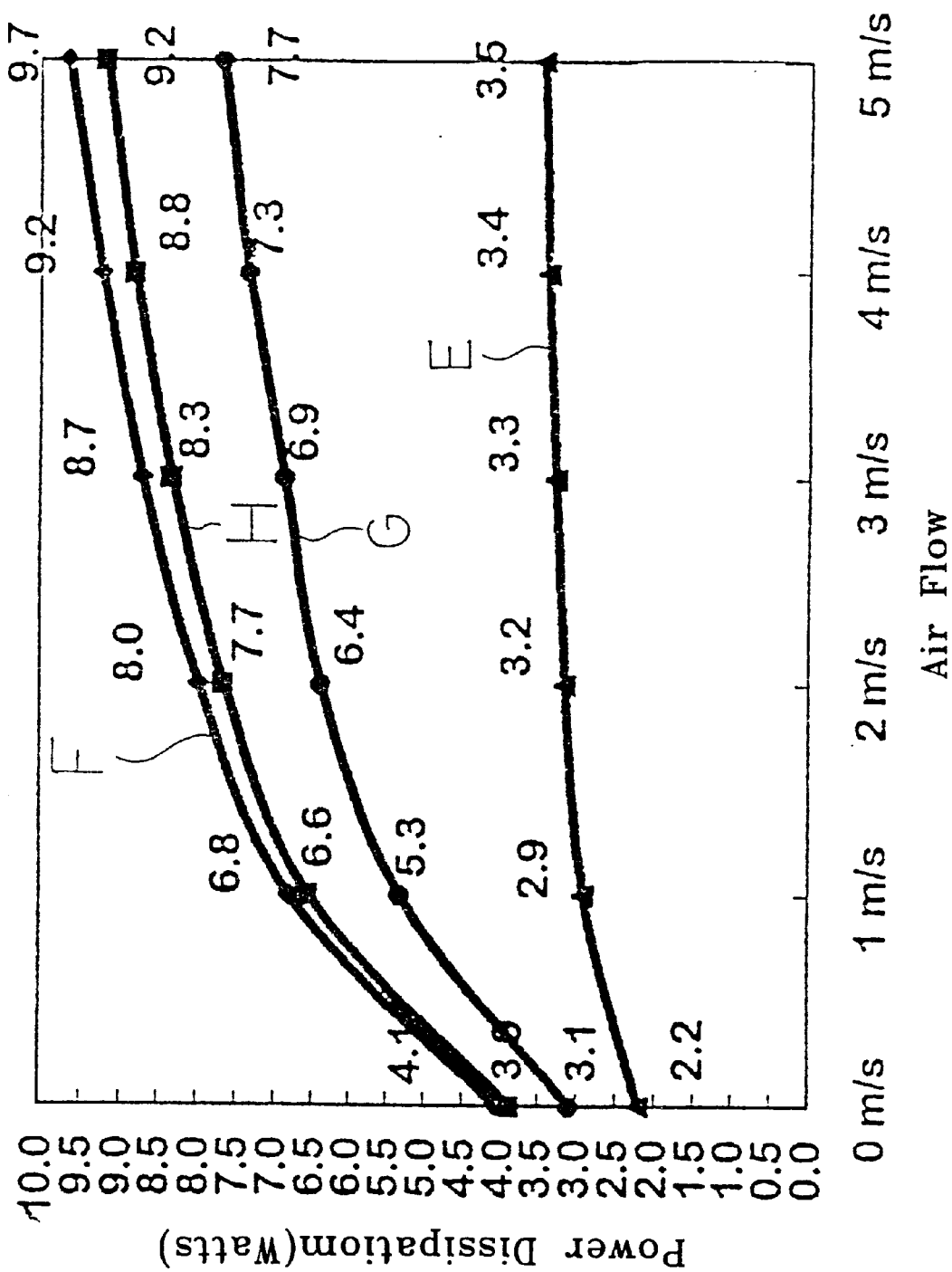
FIG. 10 shows graphs indicating the thermal resistance values shown in FIG. 9 in terms of the power dissipation values.

FIG. 10 is a graph showing a conversion value of the thermal resistance values of FIG. 9 to power dissipation values. In FIG. 9, the axis of ordinates shows power dispersion values in Watts, and the axis of abscissa shows air flows in m/sec. In FIG. 10, graph E shows power dissipation characteristic of the package according to the first embodiment of this invention, graph F shows that of the package according to the second embodiment thereof, graph G shows that of the package according to the third embodiment thereof, and graph H shows that of the package according to the fourth embodiment of this invention. As know in FIG. 10, the packages according to this invention show excellent power dispersion characteristics of 3.2 Watts or more under an air flow of 2 m/sec.

Figure 11A:
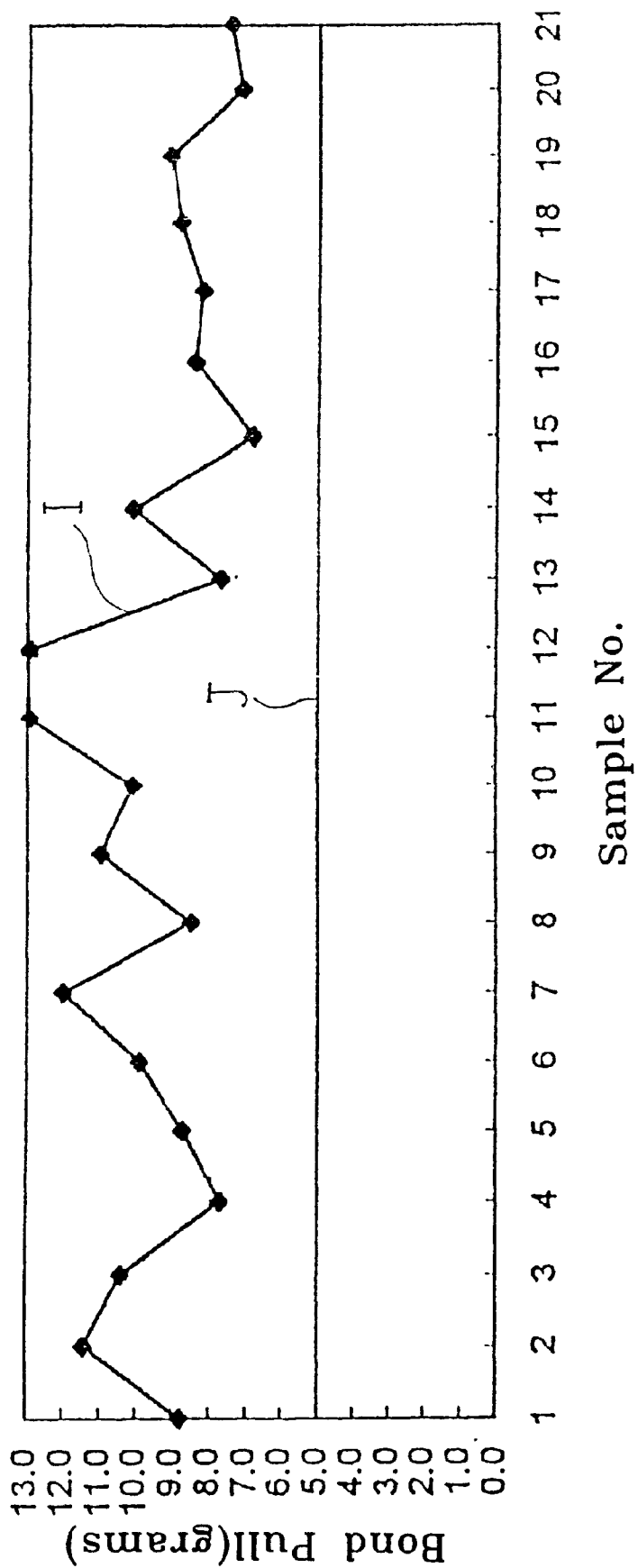
FIGS. 11A to 11C are graphs showing the properties of bonding wires in the package according to the first embodiment of the present invention.
Figure 11B:
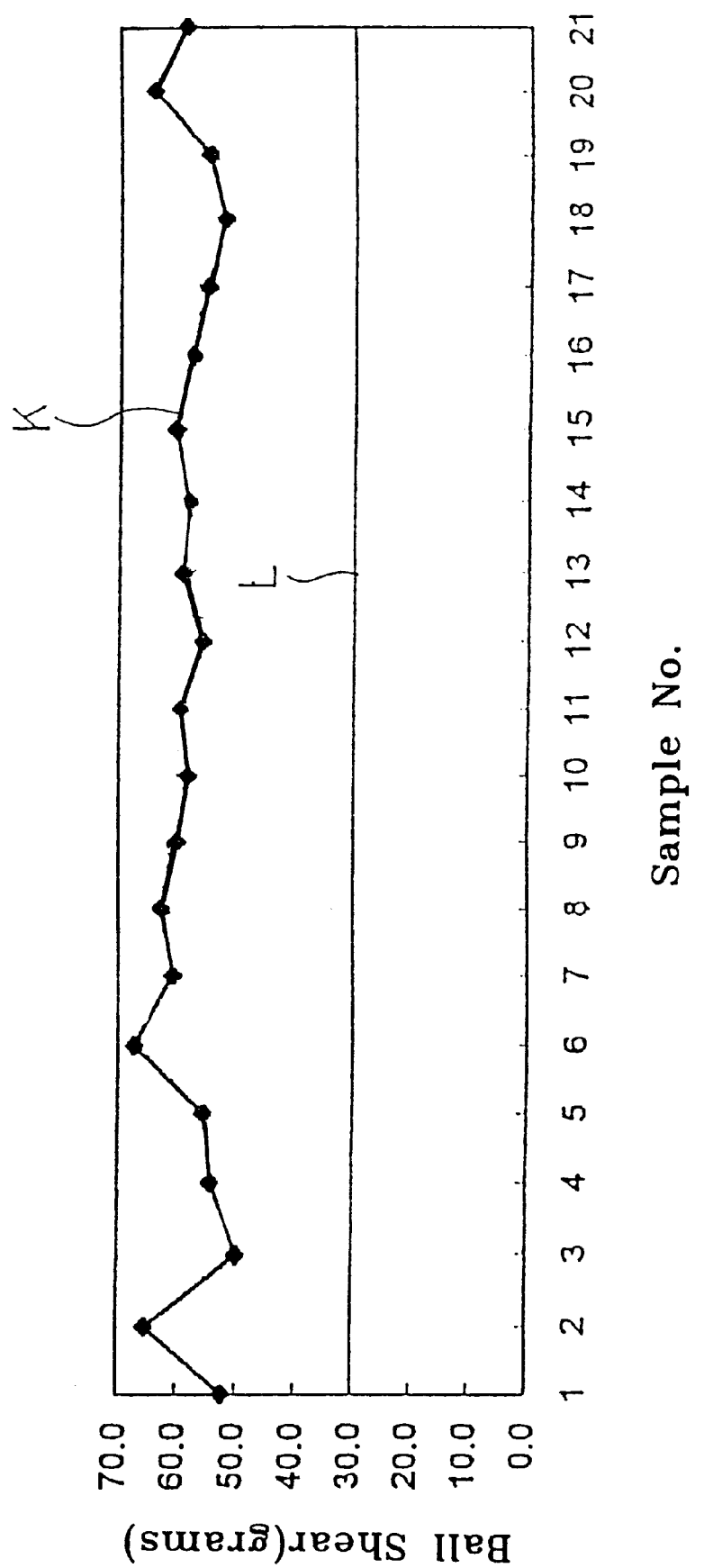
Figure 11C:
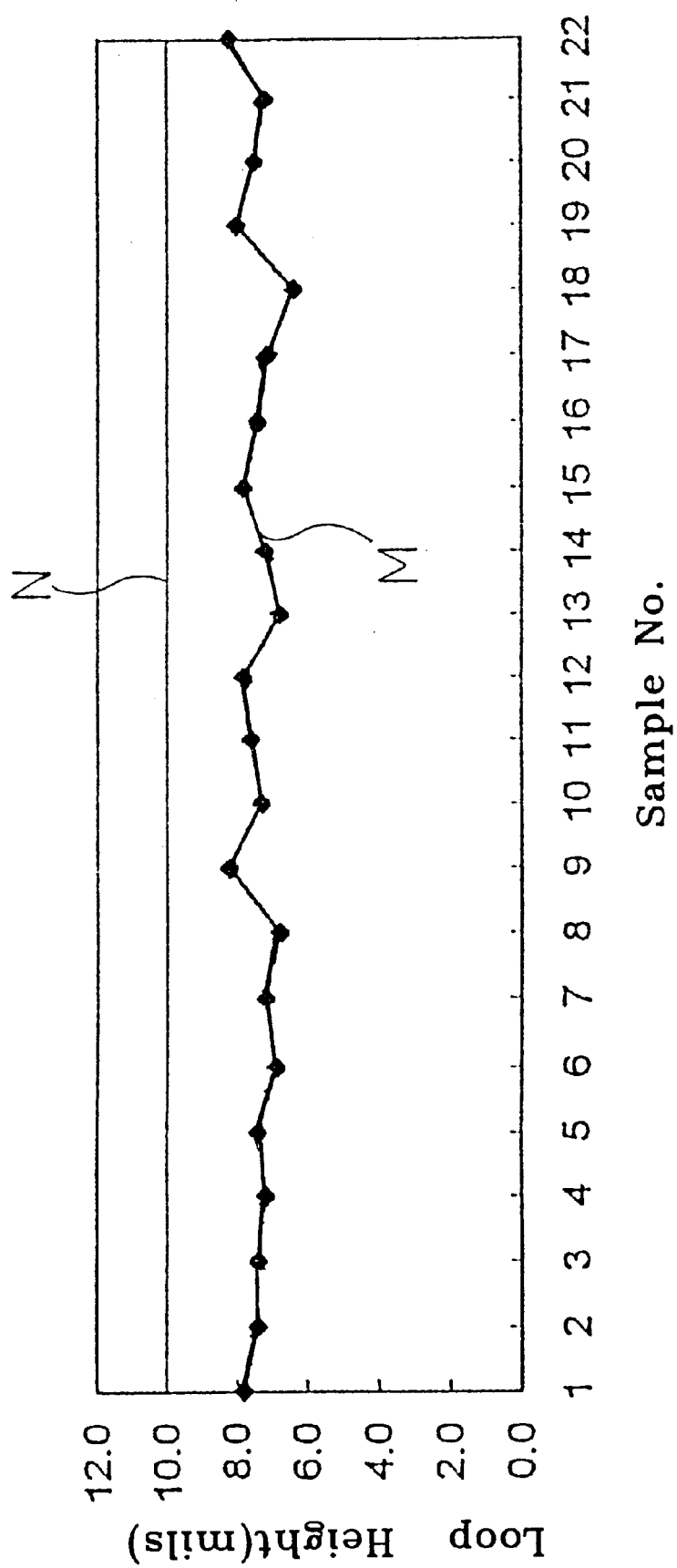

FIGS. 11(A) to (C) are graphs showing characteristics of the bond wire in the package according to the first embodiment of this invention. Here, FIG. 11(A) shows the result of the bond pull test. FIG. 11(B) shows the result of ball shear test. FIG. 11(C) shows the result of measuring a loop height. Prior to the performance of these tests, so as to carry out a wire bonding step on the heat block shown in FIG. 5, K & S 1488 Turbo wire bonder manufactured by K & S company, Korea , gold wire of 1.3 mils thickness manufactured by Mikyeong Sa, Korea and a capillary sold in the trademark of Micro Swiss 6 mil Tip were used. A wire bonding temperature is 180° C., the time is 25 msec for the first wire and the second wire, respectively, the power is 60 mW for the first wire and 120 mw for the second wire, and the force is 45 g for the first wire and 110 g for the second wire.

FIG. 11A shows that as indicated in a graph I, 21 samples all have higher values than a reference value of more than 5 g (indicated in a graph J) in a bond pull test. Therefore, it is noted that strong wire-bonding is made. FIG. 11B shows that as indicated in a graph K, 21 samples all have higher values than a reference value of more than 30 g in a ball shear test. As known from FIG. 11(C), as indicated in a graph N, 22 wire samples all passed a reference value of less than 10 mils.

As described above, from the results shown in FIG. 11A to 11C, it is confirmed that a wire bonding work at a state in which the integrated circuit chip is attached on the heater block of FIG. 5 by vacuum can guarantee a successful wire bonding result without having any bad influence on the bond wire characteristics of the package.

Figure 12A:
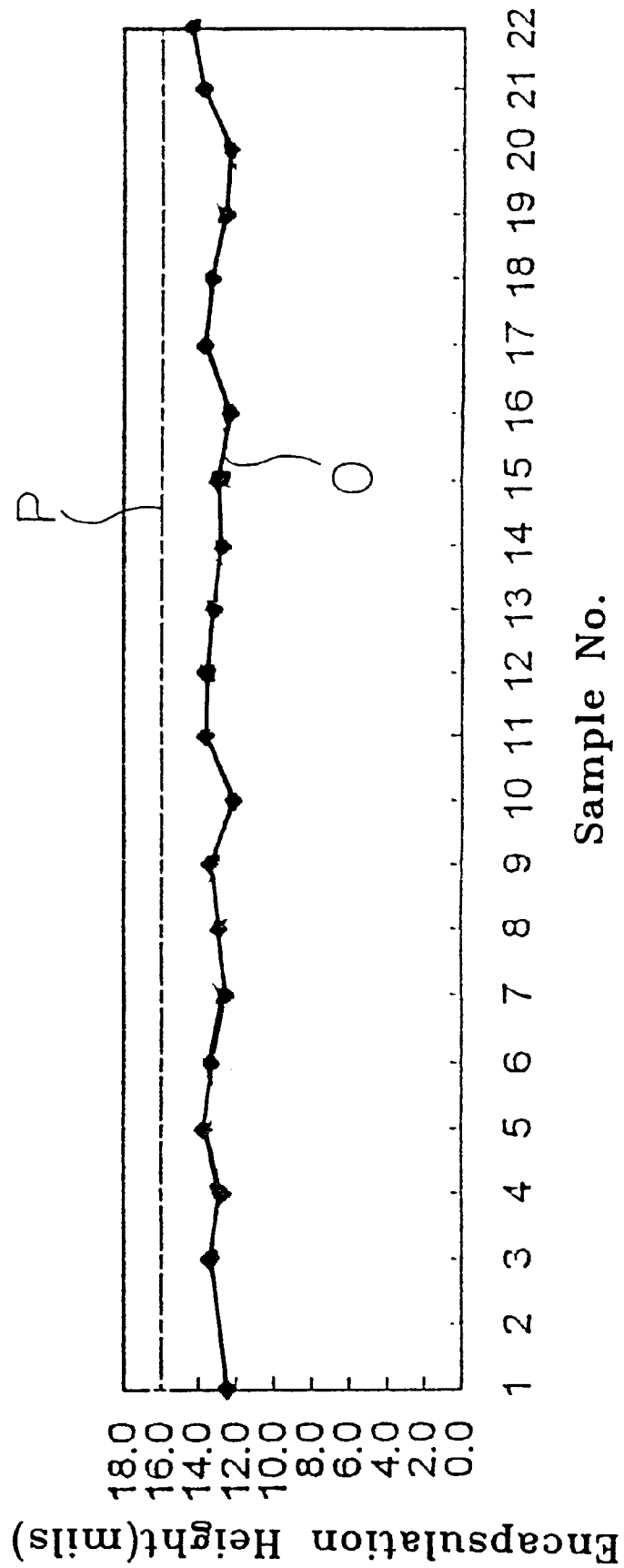
Figure 12B:
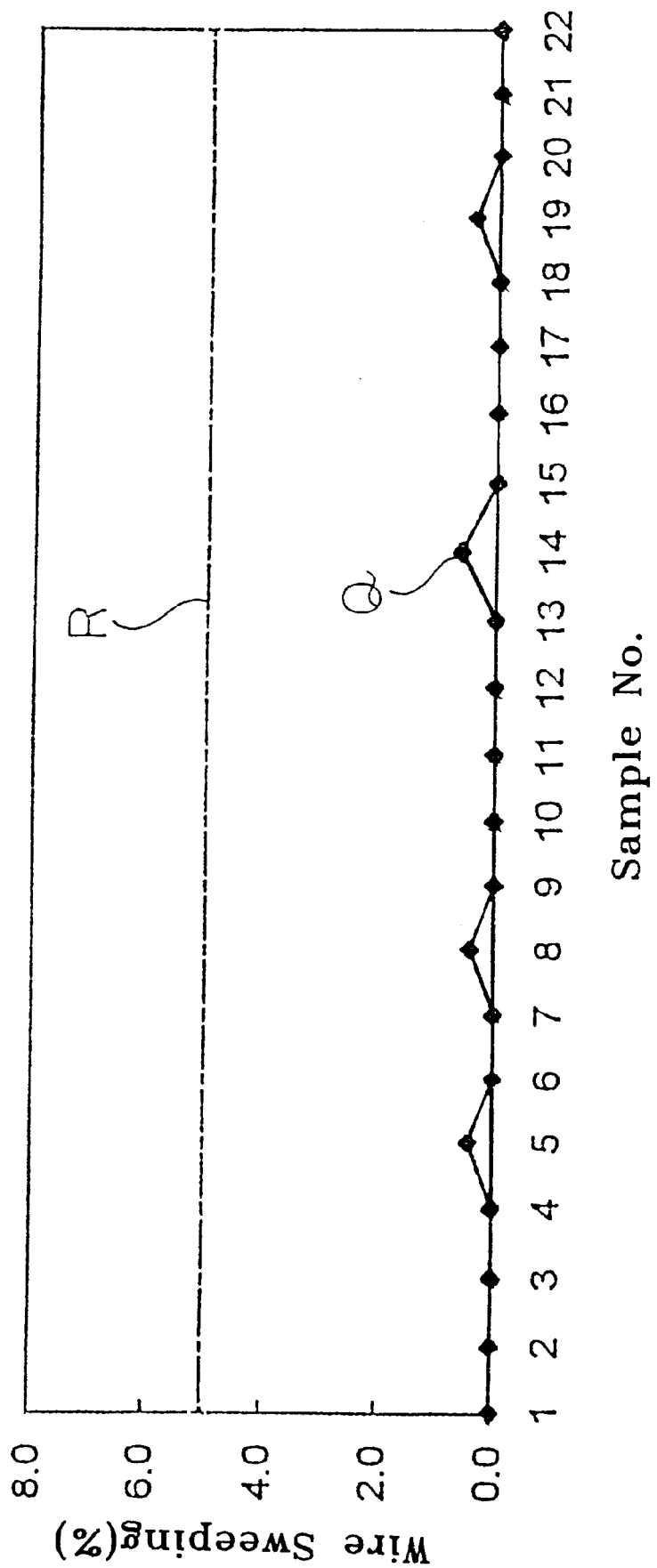

FIGS. 12A to 12C are graphs showing the encapsulant characteristics of the package according to the first embodiment of this invention. FIG. 12A shows the measurement result of the encapsulation height. FIG. 12B shows the measurement result of a wire sweeping. FIG. 12C is a measurement result of the void. Prior to performance of such tests, so as to encapsulate the package already wire bonded, on the heater block of FIG. 5 a dispense system sold in the trademark of CAMALO5000 and dam/fill material sold in the trademark of Hysol 4451/4450 were used. The encapsulation temperature is 80° C. and the encapsulation pressure is 1.4 bar. As known from FIG. 12A, as indicated in a graph 0, 22 samples passed an encapsulation height reference value of less than 16 mils(indicated in a graph P). As known in FIG. 12B, as indicated in a graph Q, 22 samples passed a reference value of less than 5.0% (indicated in a graph R) in a wire sweeping test. As known in FIG. 12C, as indicated in a graph S, 22 samples passed an encapsulation void ratio reference value of less than 5.0% (indicated in a graph T) in an encapsulation void ratio test.

From the measurement results of the above encapsulation characteristics, it is confirmed that when the encapsulation process is carried out in a state in which the integrated circuit chip is attached on the heater block shown in FIG. 5 by vacuum pressure a successful encapsulation is accomplished without having any bad influence upon the encapsulation characteristic.

Figure 13A:
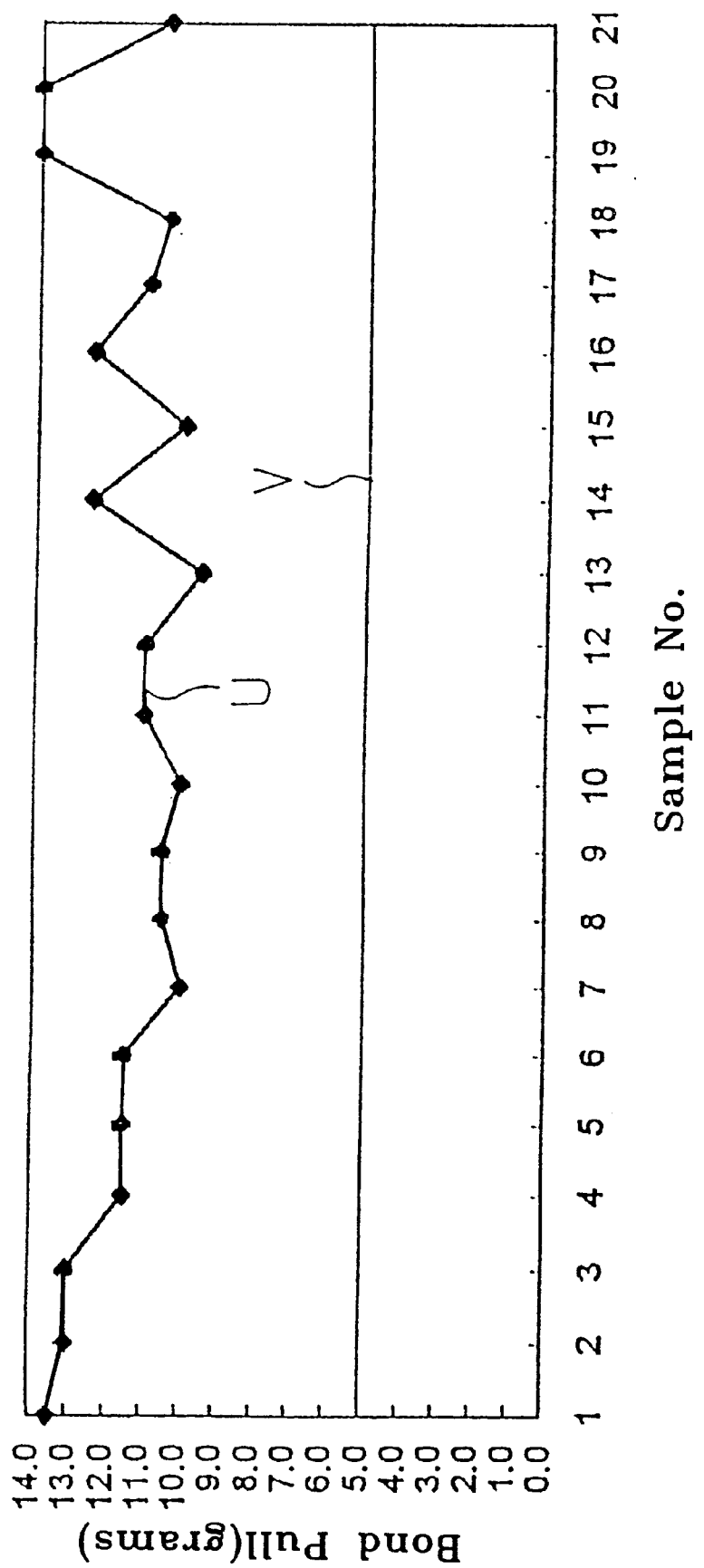
FIGS. 13A to 13C are graphs showing the properties of bonding wires in the package according to the second embodiment of the present invention.
Figure 13B:
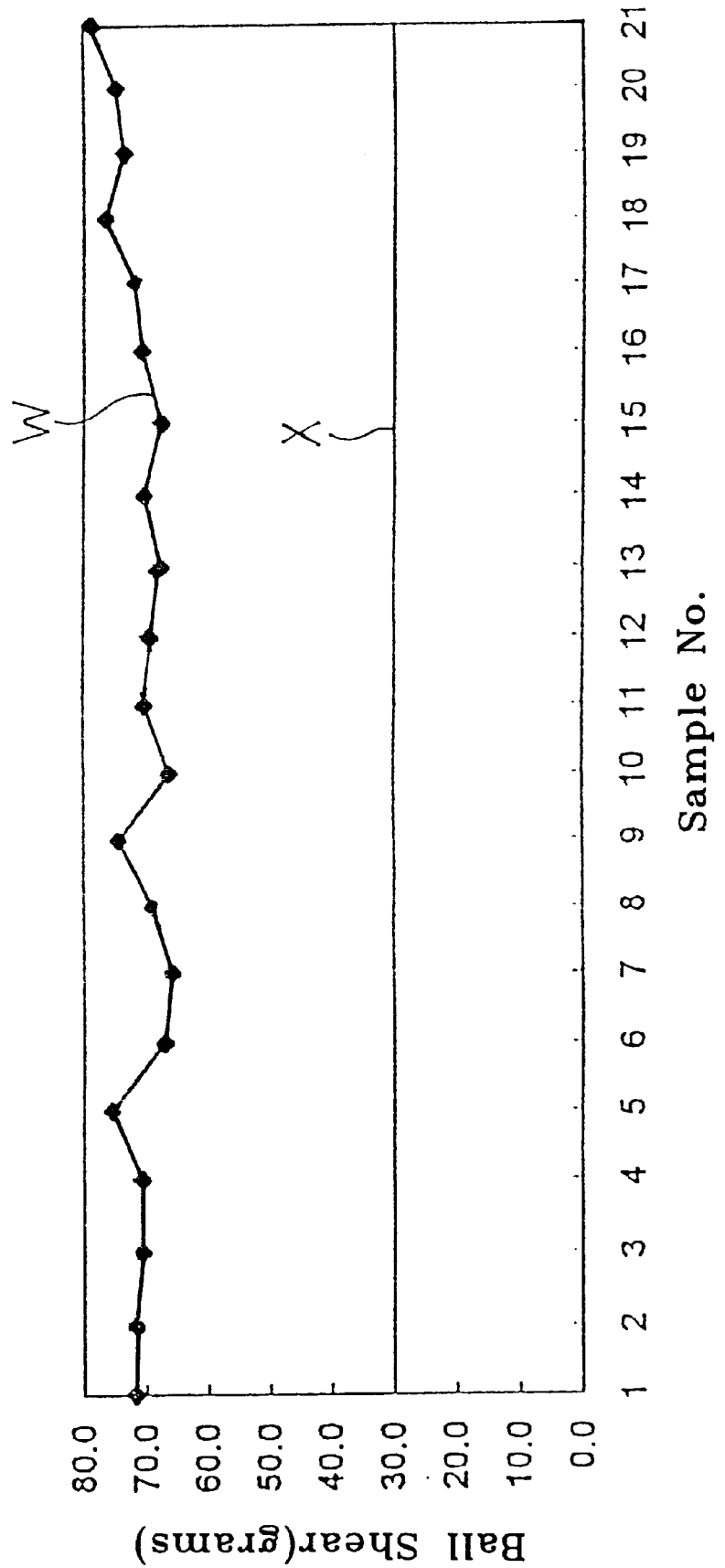
Figure 13C:
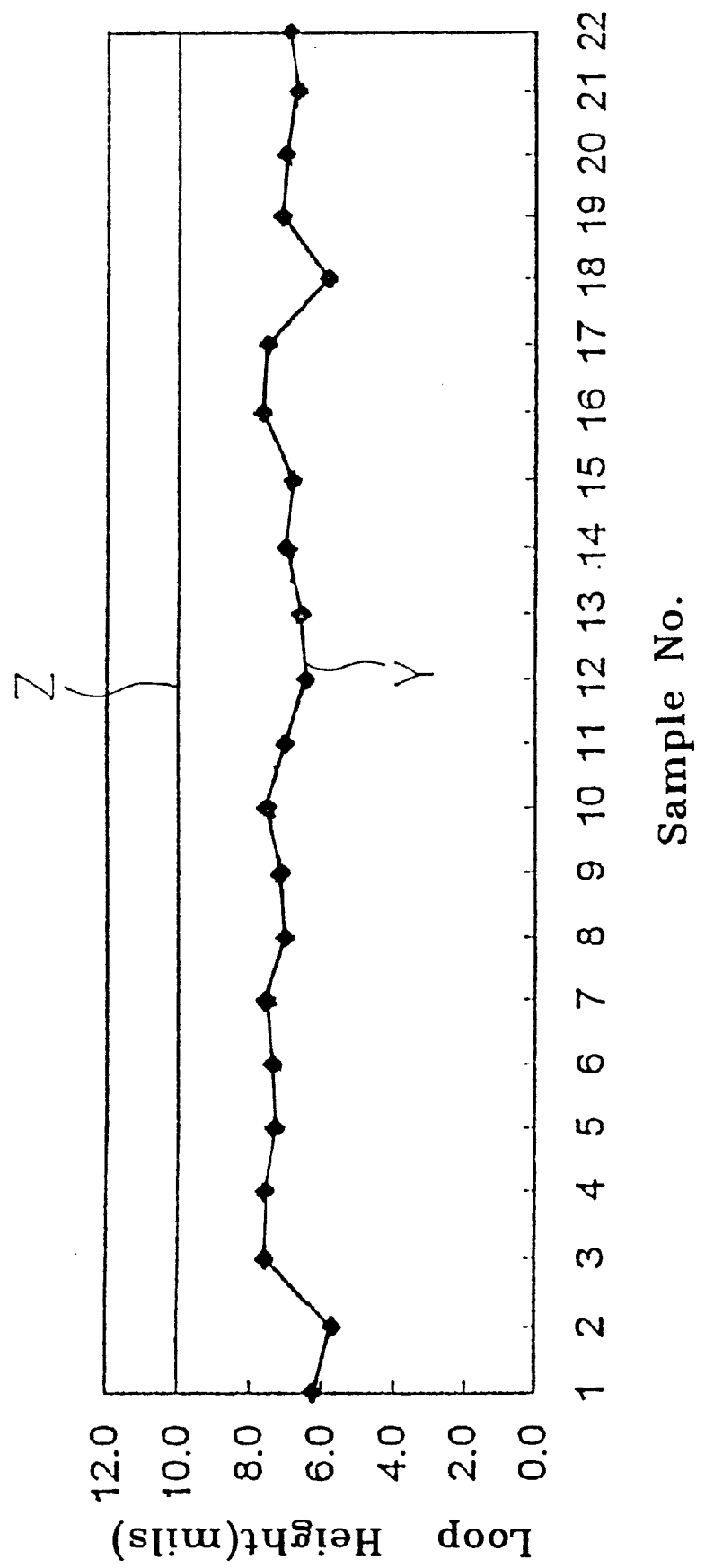

FIGS. 13A to 13C are graphs showing a bonding wire characteristic of the package according to the second embodiment of this invention. FIG. 13A shows the result of a bond pull test. FIG. 13B shows a result of a ball shear test. FIG. 13C shows the result of a loop height test.

Prior to the performance of such tests, so as to carry out a wire bonding work on the heater block shown in FIG. 5, K & S 1488 Turbo wire bonder manufactured by K & S company, Korea, gold wire of 1.3 mils diameter manufactured by Mikyeong Sa, Korea and a capillary sold in the trademark of STP were used. A wire bonding temperature is 220° C., the time is 25 msec for the first wire and is 30 msec for the second wire, the power is 60 mW for the first wire and for the second wire, respectively and the force is 45 g for the first wire and 55 g for the second wire.

FIG. 13A shows that as indicated in a graph U, 21 samples have a higher value than a reference value of more than 5 g(indicated in a graph V) in the bond pull test. Therefore, it is confirmed that a strong wire bonding is obtained. FIG. 13B shows that as indicated in a graph W, all 21 samples pass over a reference value of more than 30 g (indicated in a graph X) in a ball shear test. FIG. 13C shows that, as indicated in a graph Y, 22 wire samples all pass a reference value of 10 mils(indicated in a graph Z). From the above results, it is confirmed that a wire bonding work in a state in which the integrated circuit chip is attached on the heater block of FIG. 5 by a vacuum pressure can guarantee a successful wire bonding result.

Figure 14A:
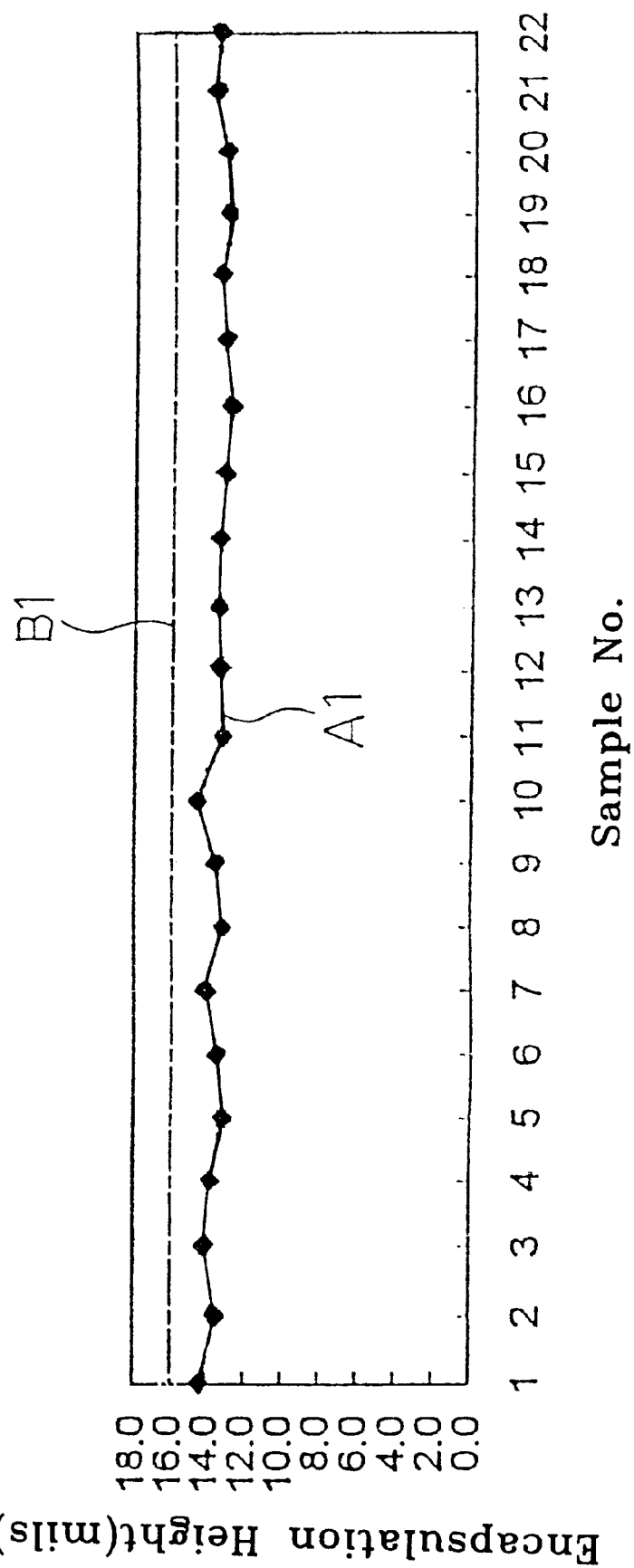
FIGS. 14A to 14C are graphs showing the encapsulation property of the package according to the second embodiment of the present invention.
Figure 14B:
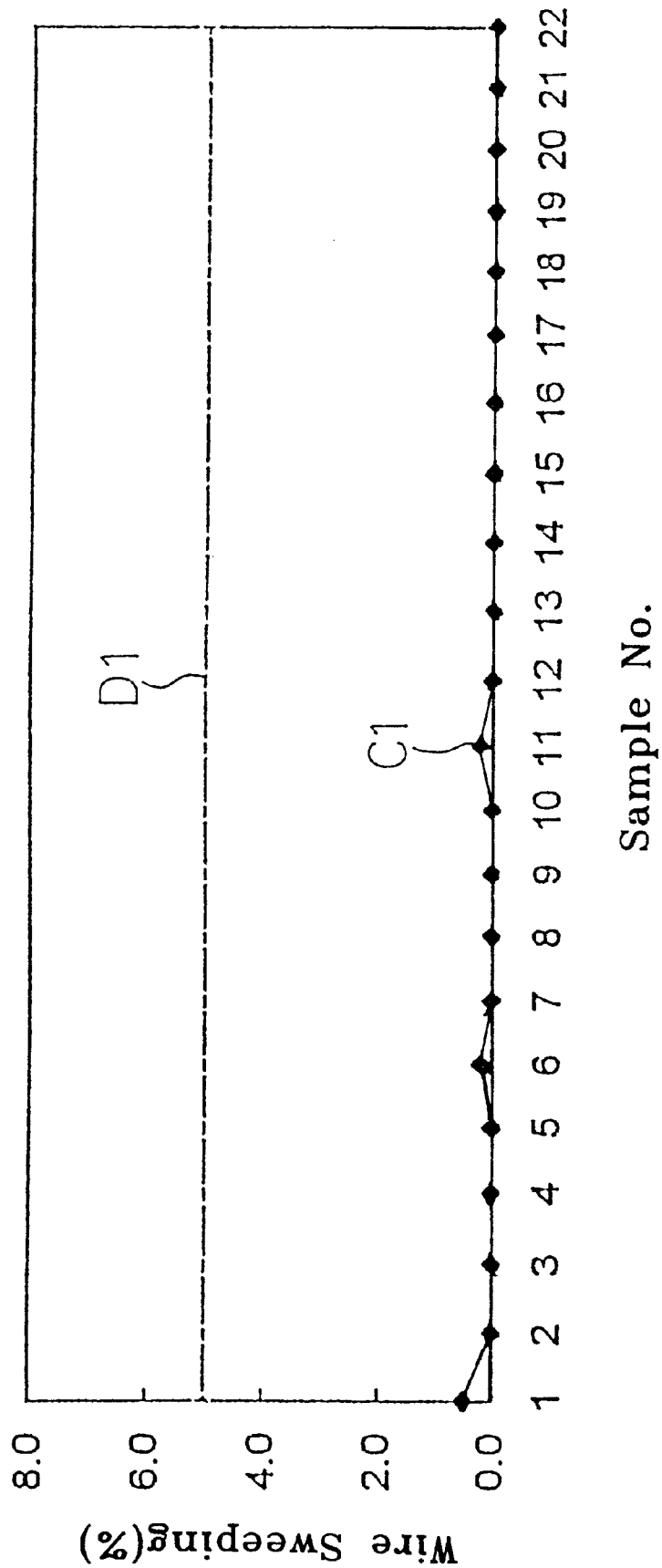
Figure 14C:
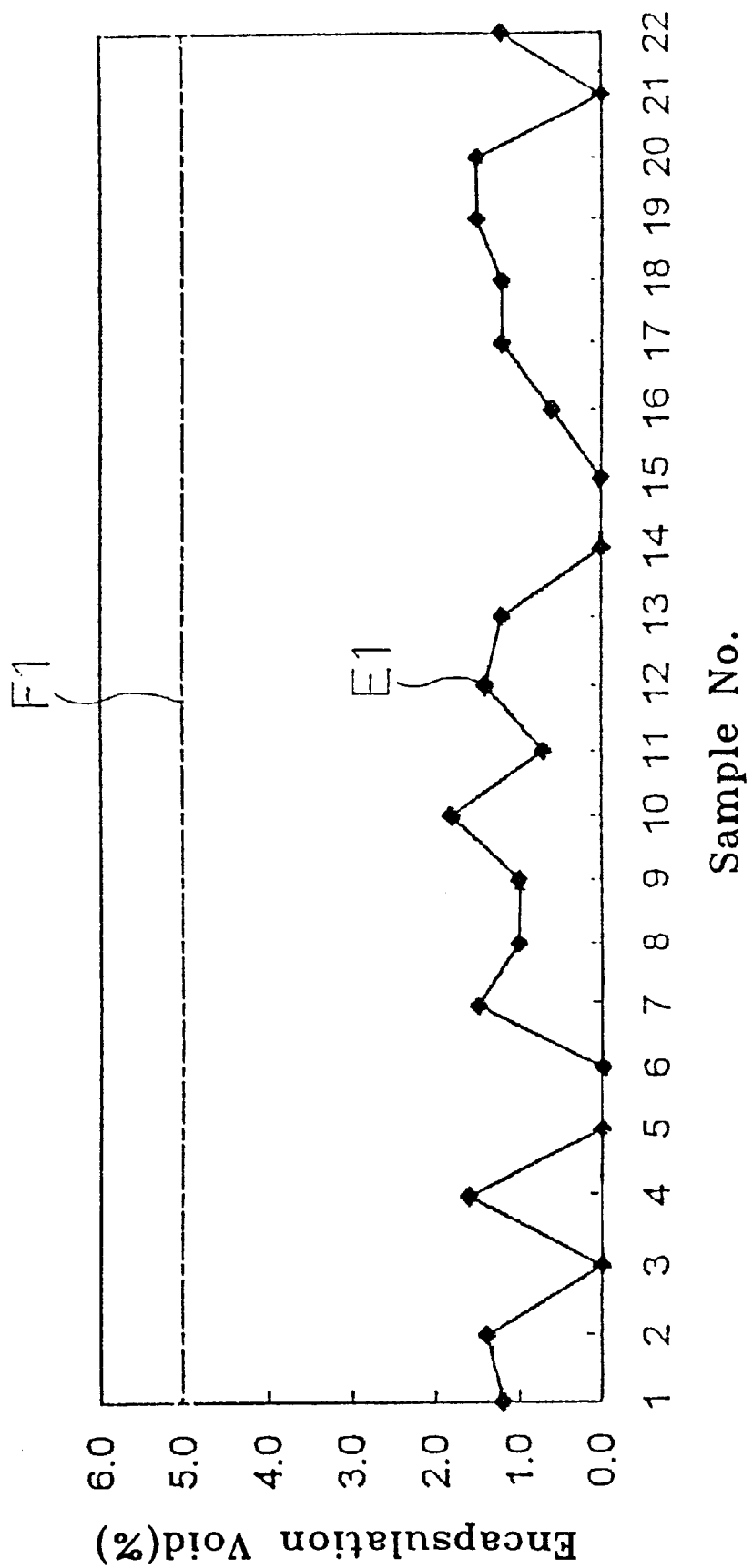

FIGS. 14A to 14C are graphs showing the encapsulation characteristic of the package according to a second embodiment of this invention wherein FIG. 14A shows the measured result of the encapsulation height, FIG. 4B shows the measured result of the wire sweeping and FIG. 4C shows the measured result of the encapsulation void.

Prior to performance of such tests, so as to encapsulate the package already wire bonded, on the heat block of FIG. 5 a dispense system sold in the trademark of CAMALO5000 and dam/fill material sold in the trademark of Hysol 4451/4450 were used. The encapsulation temperature is 80° C. and the encapsulation pressure is 1.5 bar. As known from FIG. 14A, as indicated in a graph A1, 22 samples passed an encapsulation height reference value of 16 mils (indicated in a graph B1). As known in FIG. 14B, as indicated in a graph C1, 22 samples passed a reference value of 5.0% (indicated in a graph D1) in a wire sweeping test. As known in FIG. 14C, as indicated in a graph E1, 22 samples passed an encapsulation void ratio reference value of less than 5.0% (indicated in a graph F1) in an encapsulation void ratio test. From the measured results of the above encapsulation characteristics shown in FIGS. 14A to 14C, it is confirmed that when the encapsulation process is carried out in a state in which the integrated circuit chip is attached on the heat block shown in FIG. 5 by vacuum pressure a successful encapsulation is accomplished without having any bad influence upon the encapsulation characteristic.

Figure 15A:
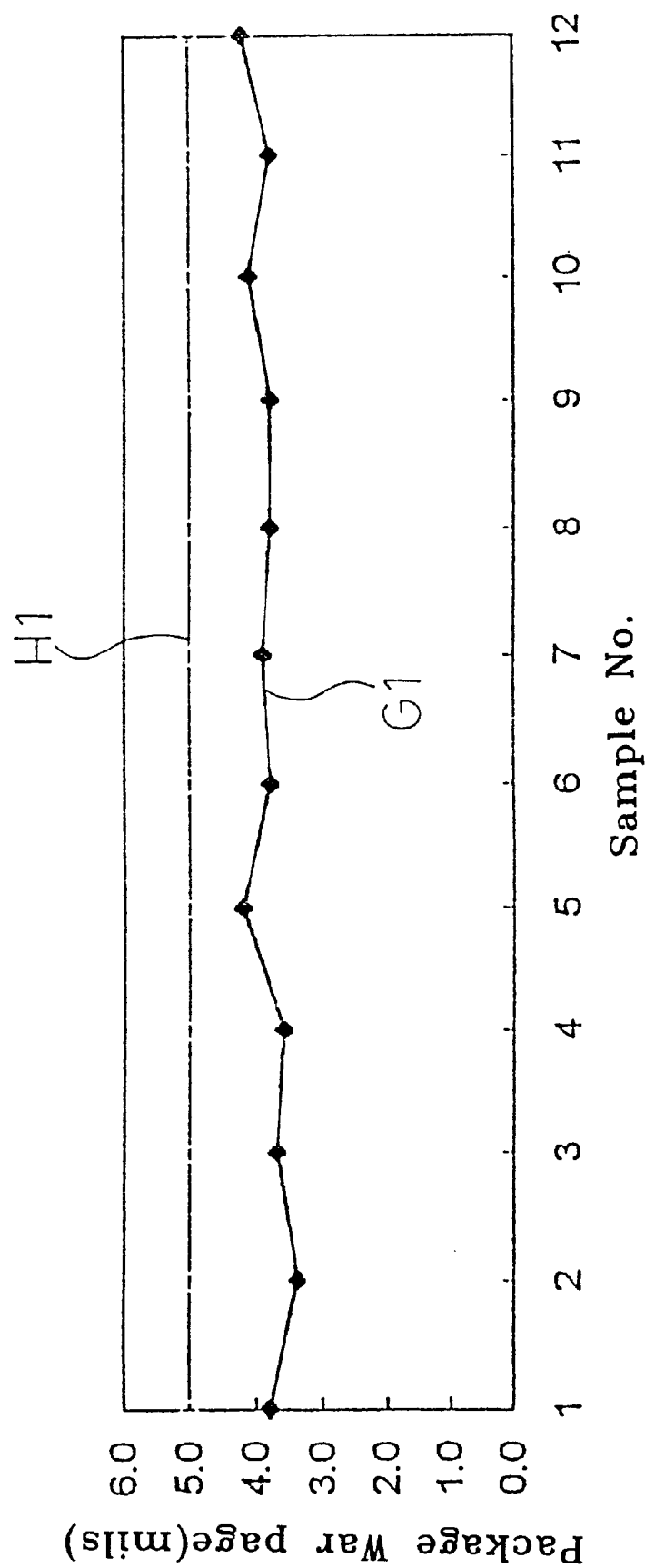
FIGS. 15A to 15C are graphs showing the ball mount property of the package according to the second embodiment of the present invention.
Figure 15B:
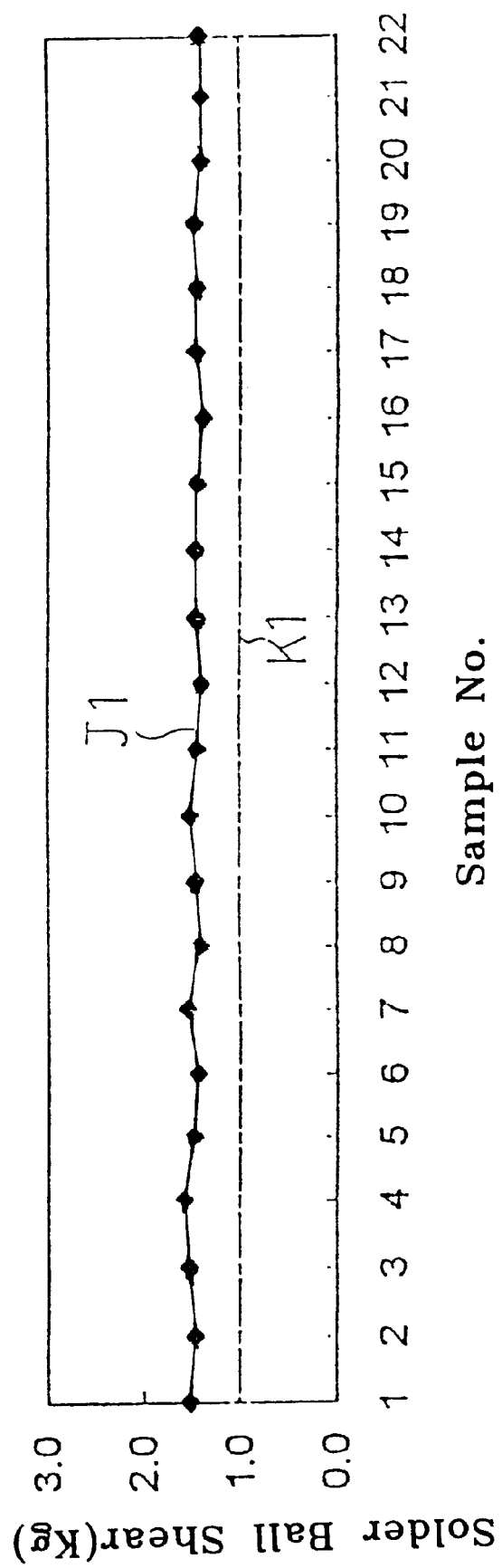
Figure 15C:
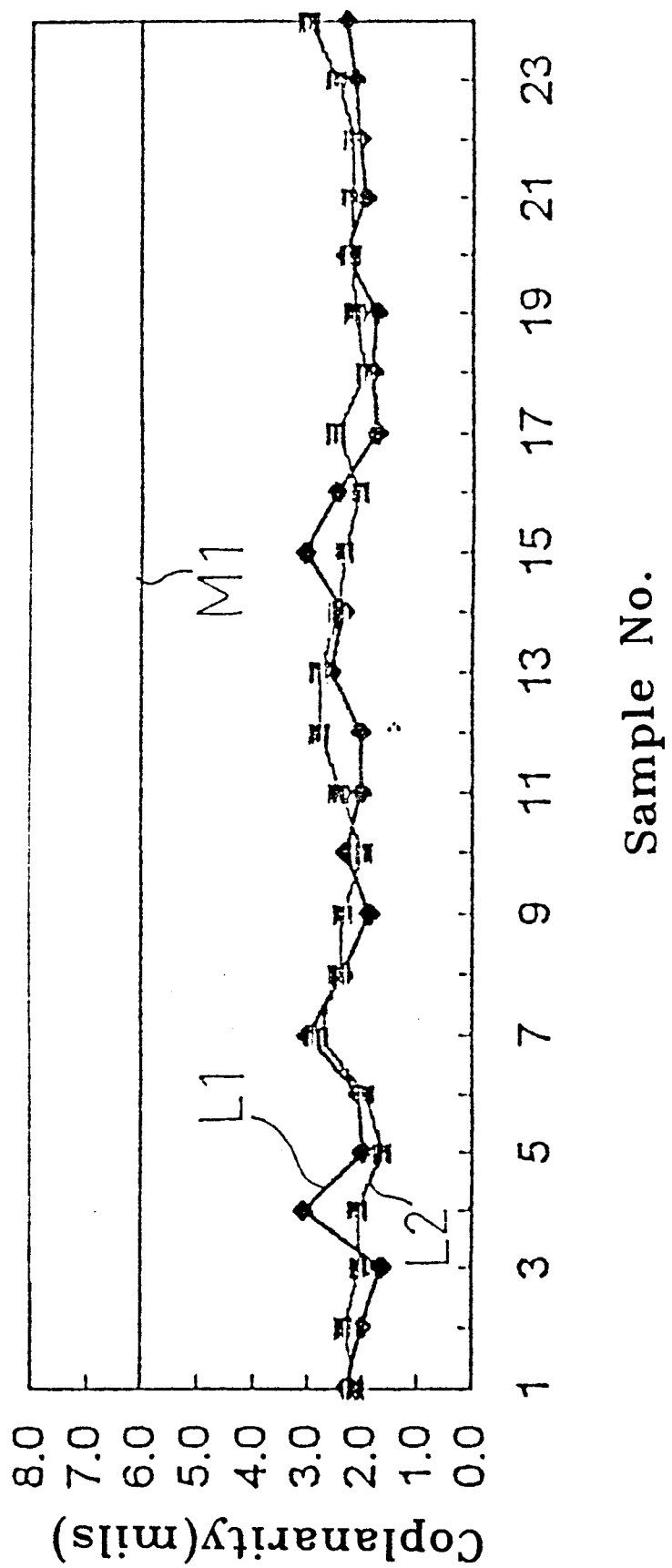

FIGS. 15A to 15C are graphs showing a ball mount characteristic of the package according to the second embodiment of this invention wherein FIG. 15A shows the measured result of a package warpage, FIG. 15B shows the measured result of a solder ball shear test and FIG. 15C shows the measured result of coplanarity. Prior to the performance of these tests, so as to mount a plurality of solder balls in the encapsulated package, a ball mounter sold in the trademark of SHIBUYA SBM-230, a furnace sold in the trademark of VITRONICS SMD-522N, a flux cleaner sold in the trademark of ACCEL MICROCEL 2 and a solder ball sold in the trademark of SENJU 63Sn/37Pb were used. Here, the furnace peak temperature is 225±5° C., and a flux cleaning time is 120 sec for the wash, 120 sec for the rinse and 180 sec for the dry. FIG. 15A shows that, as indicated in a graph G1, 12 samples all passed over a package warpage reference value of 5.0 mils(indicated in a graph H1). Furthermore, FIG. 15B shows that as indicated in a graph J1, 22 solder ball samples pass under a shear force reference value of less than 1 Kg(indicated in a graph K1). FIG. 15C shows that as indicated in graphs L1 and L2, 48 samples for 2 coplanarity tests where 24 samples are used for 1 coplanarity test pass under a coplanarity reference value of less than 6 mils(indicated in a graph M1). As known from the results of FIGS. 14A to 14C, it is confirmed that solder balls are mounted successfully in the package according to a second embodiment of this invention.

Regarding the packages according to a third embodiment and a fourth embodiment of this invention, tests about a wire bonding characteristic, an encapsulant characteristic and a solder ball mount characteristic was not performed. However, though such tests are not carried out in this invention these inventors can anticipate that the packages according to the third embodiment and the fourth embodiment will have similar wire bonding characteristic, encapsulant characteristic, and solder ball mount characteristic as those according to the second embodiment of this invention since the packages according to the third embodiment and the fourth embodiment has a structural similarity to the package according to the second embodiment of this invention in that they each has a heat sink attached to the second surface of the integrated circuit chip.

As described above, the ball grid array package according to this invention has the integrated circuit chip exposed to the exterior of the package or has a shallow pin or foil attached on the surface of the exposed integrated circuit chip. Therefore, the package according to this invention has benefits of excellent heat dissipation characteristic, low weight, a thin thickness and low manufacturing cost.

A detailed several embodiments of this invention and their methods of manufacture is provided above. While the description of the invention has been made with reference to these specific embodiments and methods, the description is only illustrative of the invention and is not to be construed as limiting the invention. Various modifications and methods by those skilled in the art without departing from the true spirit and scope of the invention as defined by the appended claims.

What is claimed is:

1. A packaged integrated circuit device, comprising:
    an interconnection substrate having at least one conductive trace layer and at least one insulating layer and also having a first surface and a second surface having a plurality of electrical contacts thereon, opposite to the first surface of the interconnection substrate;
    a dielectric layer attached to an outer portion of the first surface of the interconnection substrate;
    a metal thermal conductive layer having a first surface and a second surface opposite to the first surface thereof, the first surface of the metal thermal conductive layer being attached to an internal portion of the first surface of the interconnection substrate and also being in contact with the internal end portion of the dielectric layer;
    a hole region which is formed at the central portion of the interconnection substrate and which exposes the first surface of the metal thermal conductive layer;
    an integrated circuit chip disposed within the hole region, the integrated circuit chip having a first surface attached the first surface of the interconnection substrate and a second surface opposite to the first surface of the integrated circuit chip, the second surface of the integrated circuit chip having a plurality of bonding pads formed thereon;
    a plurality of bond wires for electrically connecting the bond pads with the conductive trace layer; and
    an encapsulant material enclosing bond wires and the integrated circuit chip, the hole region being filled with the encapsulant material.

2. The packaged integrated circuit device of claim 1, wherein, the integrated circuit chip is aligned and held within the hole region by a sucking force of vacuum acting on the first surface thereof, and the plurality of bond pads on the integrated circuit chip and the conductive trace layer are electrically connected to each other by the plurality of bond wires in a condition where the sucking force acts.

3. The packaged integrated circuit device of claim 1, wherein the thermal conductive foil is made of a material selected from the group consisting of copper, aluminum, and silver.

4. The packaged integrated circuit device of claim 1, wherein the conductive trace layer is made of copper.

5. The packaged integrated circuit device of claim 1, the hole region has a circular cross sectional shape and includes at least one ear portion of a circular shape.

6. The packaged integrated circuit device of claim 1, wherein the plurality of electrical contacts are solder balls.

7. The packaged integrated circuit device of claim 1, wherein the integrated circuit chip is attached to the metal thermal conductive metal layer by an adhesive material containing silver.

8. The packaged integrated circuit device of claim 1, wherein the dielectric layer is made of a material selected from a group consisting of solder resist, polyimide, and epoxy.

* * * * *

UNITED STATES PATENT AND TRADEMARK OFFICE
CERTIFICATE OF CORRECTION

PATENT NO : 6,060,778
DATED : May 9, 2000
INVENTOR(S): Jeong et al

It is certified that error appears in the above-identified patent and that said Letters Patent are hereby corrected as shown below:

At col. 12, line 57, please cancel "FIG. 4B" and substitute --FIG. 14B-- therefor; and at line 58, please cancel "FIG. 4C" and substitute --FIG. 14C-- therefor.

Signed and Sealed this

Twenty-second Day of May, 2001

*Attest:*

NICHOLAS P. GODICI

*Attesting Officer*  *Acting Director of the United States Patent and Trademark Office*